United States Patent
Kubo et al.

(10) Patent No.: US 12,313,869 B2
(45) Date of Patent: *May 27, 2025

(54) OPTICAL FILTER, OPTICAL DEVICE, AND LIGHT-ABSORBING COMPOSITION

(71) Applicant: Nippon Sheet Glass Company, Limited, Tokyo (JP)

(72) Inventors: Yuichiro Kubo, Tokyo (JP); Katsuhide Shimmo, Kanagawa (JP)

(73) Assignee: NIPPON SHEET GLASS COMPANY, LIMITED, Tokyo (JP)

( * ) Notice: Subject to any disclaimer, the term of this patent is extended or adjusted under 35 U.S.C. 154(b) by 155 days.

This patent is subject to a terminal disclaimer.

(21) Appl. No.: 18/248,836

(22) PCT Filed: Sep. 22, 2021

(86) PCT No.: PCT/JP2021/034864
§ 371 (c)(1),
(2) Date: Apr. 12, 2023

(87) PCT Pub. No.: WO2022/080105
PCT Pub. Date: Apr. 21, 2022

(65) Prior Publication Data
US 2023/0400615 A1    Dec. 14, 2023

(30) Foreign Application Priority Data
Oct. 13, 2020   (JP) ................. 2020-172611

(51) Int. Cl.
*G02B 5/22* (2006.01)
*C08G 77/18* (2006.01)
*C09D 5/32* (2006.01)

(52) U.S. Cl.
CPC ............. *G02B 5/226* (2013.01); *C08G 77/18* (2013.01); *C09D 5/32* (2013.01); *G02B 5/223* (2013.01)

(58) Field of Classification Search
CPC .......... G02B 5/223; G02B 5/226; C09D 5/32; C08G 77/18
See application file for complete search history.

(56) References Cited

U.S. PATENT DOCUMENTS 6,284,385 B1    9/2001   Guillaumon et al.
2018/0003872 A1  1/2018   Kubo et al.
(Continued)

FOREIGN PATENT DOCUMENTS

JP    S5984920 A    5/1984
JP    2007153691 A  6/2007
(Continued)

OTHER PUBLICATIONS

U.S. Appl. No. 17/604,213, filed Oct. 15, 2021, US 2022-0206198 A1.
(Continued)

*Primary Examiner* — Bijan Ahvazi
(74) *Attorney, Agent, or Firm* — HSML P.C.

(57) ABSTRACT

An optical filter 1a has a first transmission spectrum satisfying the following requirements (i), (ii), (iii), and (iv) at 25° C. (i) A minimum of a transmittance in a wavelength range of 450 nm to 600 nm is 70% or more. (ii) A maximum of the transmittance in a wavelength range of 300 nm to 370 nm is 5% or less. (iii) A maximum of the transmittance in a wavelength range of 800 nm to 1000 nm is 5% or less. (iv) A minimum of the transmittance in a wavelength range of 1500 nm to 1700 nm is 60% or more.

20 Claims, 6 Drawing Sheets

(56) References Cited

U.S. PATENT DOCUMENTS

| | | |
|---|---|---|
| 2019/0346601 A1 | 11/2019 | Kubo et al. |
| 2020/0040161 A1* | 2/2020 | Kubo .................. C08K 5/5317 |
| 2020/0158930 A1 | 5/2020 | Kubo |
| 2020/0198298 A1 | 6/2020 | Imanishi et al. |
| 2022/0057556 A1 | 2/2022 | Kubo et al. |
| 2022/0206198 A1* | 6/2022 | Kubo ....................... C07F 1/08 |

FOREIGN PATENT DOCUMENTS

| | | | |
|---|---|---|---|
| JP | 2009242650 A | | 10/2009 |
| JP | 2015174270 A | | 10/2015 |
| JP | 6232161 B1 | | 11/2017 |
| JP | 6281023 B2 | | 2/2018 |
| JP | 6339755 B1 | | 6/2018 |
| JP | 6639764 B1 | | 2/2020 |
| WO | 2016121855 A1 | | 8/2016 |
| WO | WO-2017126528 A1 * | 7/2017 | .............. G02B 5/22 |
| WO | 2018173386 A1 | | 9/2018 |
| WO | 2019030106 A1 | | 2/2019 |
| WO | 2019044758 A1 | | 3/2019 |
| WO | 2020054400 A1 | | 3/2020 |

OTHER PUBLICATIONS

International Search Report and Written Opinion issued for International Patent Application No. PCT/JP2021/034864, Date of mailing: Dec. 7, 2021, 8 pages including English translation of Search Report.

International Search Report and Written Opinion issued for International Patent Application No. PCT/JP2020/016925, Date of mailing: Jul. 14, 2020, 8 pages including English translation of Search Report.

* cited by examiner

—— 25°C  - - - 70°C

OPTICAL FILTER, OPTICAL DEVICE, AND LIGHT-ABSORBING COMPOSITION

TECHNICAL FIELD

The present invention relates to an optical filter, an optical apparatus, and a light-absorbing composition.

BACKGROUND ART

In imaging apparatuses employing a solid-state image sensing device such as a charge coupled device (CCD) or a complementary metal oxide semiconductor (CMOS), any of various optical filters is placed in front of the solid-state image sensing device in order to obtain images with good color reproduction. Solid-state image sensing devices generally have spectral sensitivity over a wide wavelength range from the ultraviolet to infrared regions. On the other hand, the visual sensitivity of humans lies solely in a visible region. Thus, a technique is known in which an optical filter blocking a portion of infrared light or ultraviolet light is placed in front of a solid-state image sensing device in an imaging apparatus in order to allow the spectral sensitivity of the solid-state image sensing device to approximate to the visual sensitivity of humans.

It has been common for such an optical filter to block infrared or ultraviolet by means of light reflection by a dielectric multilayer film. In recent years, optical filters including a light absorber-including film have been attracting attention. The transmittance properties of optical filters including a light absorber-including film are unlikely to be dependent on the incident angle, and this makes it possible to obtain favorable images with less color change even when light is obliquely incident on the optical filters in imaging apparatuses. Moreover, optical filters of light-absorbing type not including a light-reflecting film is advantageous in obtaining good backlit or nightscape images because such optical filters can reduce occurrence of ghosting and flare caused by multiple reflection in the light-reflecting film. Moreover, optical filters including a light absorber-including film are advantageous also in terms of reducing the size and thickness of imaging apparatuses. For example, light absorbers formed by a phosphonic acid and copper ion are known as light absorbers for such use.

For example, Patent Literature 1 describes an optical filter including a light absorber formed by a phosphonic acid containing a phenyl or halogenated phenyl group and copper ion.

Patent Literature 2 describes an optical filter including an UV-IR-absorbing layer capable of absorbing infrared and ultraviolet. The UV-IR-absorbing layer includes an UV-IR absorber formed by a phosphonic acid and copper ion.

Patent Literature 3 describes an infrared cut filter including an organic-dye-including layer and a copper-phosphonate-including layer.

Patent Literature 4 describes an optical filter including a light-absorbing film. The light-absorbing film is formed of a cured product of a liquid composition including a light absorber formed by an aryl-containing phosphonic acid and copper ion. Patent Literature 4 describes a transmission spectrum of the optical filter in the wavelength range of 300 nm to 2200 nm.

CITATION LIST

Patent Literature

Patent Literature 1: JP 6339755 B1
Patent Literature 2: JP 6232161 B1
Patent Literature 3: JP 6281023 B2
Patent Literature 4: JP 6639764 B1

SUMMARY OF INVENTION

Technical Problem

According to the techniques described in Patent Literatures 1 to 4, it is possible to absorb a portion of ultraviolet and light belonging to infrared in the wavelength range of 700 to 1000 nm. However, from the viewpoint of increasing the transmittances of the optical filters in a given wavelength range including longer wavelengths, the techniques described in Patent Literatures 1 to 4 leave room for reexamination. Therefore, the present invention provides an optical filter blocking a portion of ultraviolet and light belonging to infrared in the wavelength range of 700 to 1000 nm, the optical filter having a high transmittance in the visible region and a given wavelength range including longer wavelengths. The present invention also provides a light-absorbing composition advantageous in producing such an optical filter.

Solution to Problem

The present invention provides an optical filter showing a first transmission spectrum satisfying the following requirements (i), (ii), (iii), and (iv) at 25° C.:
(i) a minimum of a transmittance in a wavelength range of 450 nm to 600 nm is 70% or more;
(ii) a maximum of the transmittance in a wavelength range of 300 nm to 370 nm is 5% or less;
(iii) a maximum of the transmittance in a wavelength range of 800 nm to 1000 nm is 5% or less; and
(iv) a minimum of the transmittance in a wavelength range of 1500 nm to 1700 nm is 60% or more.

The present invention also provides an optical apparatus including:
a camera module capable of obtaining image information on an object, the image information being recognized by means of visible light;
a TOF sensor capable of obtaining distance measurement information on a distance from an object; and
the above optical filter placed in front of the camera module and the TOF sensor.

The present invention also provides a light-absorbing composition including:
a copper complex;
at least one selected from the group consisting of a first alkoxy-containing compound having two alkoxy groups per molecule and a hydrolysate of the first alkoxy-containing compound; and
at least one selected from the group consisting of a second alkoxy-containing compound having three or four alkoxy groups per molecule and a hydrolysate of the second alkoxy-containing compound.

Advantageous Effects of Invention

The above optical filter blocks a portion of ultraviolet and light in the wavelength range of 700 to 1000 nm and has a high transmittance in the visible region and in a given wavelength range including longer wavelengths. Moreover, such an optical filter can be produced using the above light-absorbing composition.

DESCRIPTION OF EMBODIMENTS

Hereinafter, embodiments of the present invention will be described with reference to the drawings. The following description is directed to some examples of the present invention, and these examples do not limit the present invention.

Figure 1:
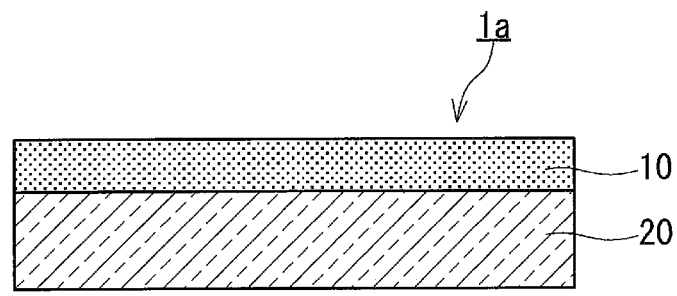
FIG. 1 is a cross-sectional view showing an example of the optical filter according to the present invention.

An optical filter 1a shown in FIG. 1 has a first transmission spectrum at 25° C. The first transmission spectrum satisfies the following requirements (i), (ii), (iii), and (iv).

(i) A minimum $T^{min}_{450-600}$ of a transmittance in a wavelength range of 450 nm to 600 nm is 70% or more.

(ii) A maximum $T^{max}_{300-370}$ of the transmittance in a wavelength range of 300 nm to 370 nm is 5% or less.

(iii) A maximum $T^{max}_{800-1000}$ of the transmittance in a wavelength range of 800 nm to 1000 nm is 5% or less.

(iv) A minimum $T^{min}_{1500-1700}$ of the transmittance in a wavelength range of 1500 nm to 1700 nm is 60% or more.

Herein, that a minimum $T^{min}_{X-Y}$ of the transmittance in a wavelength range of X nm to Y nm is A % or more means that the transmittance is A % or more throughout the wavelength range of X nm to Y nm. Moreover, that a maximum $T^{max}_{X'-Y'}$ of the transmittance in a wavelength range of X' nm to Y' nm is B % or less means that the transmittance is B % or less throughout the wavelength range of X' nm to Y' nm.

Since the first transmission spectrum of the optical filter 1a satisfies the requirement (i), the optical filter 1a has a high transmittance in a visible region. The minimum $T^{min}_{450-600}$ is desirably 75% or more, and more desirably 80% or more.

Since the first transmission spectrum of the optical filter 1a satisfies the requirement (ii), the optical filter 1a can block a portion of ultraviolet. The maximum $T^{max}_{300-370}$ is desirably 3% or less, and more desirably 1% or less.

Since the first transmission spectrum of the optical filter 1a satisfies the requirement (iii), the optical filter 1a can block light in the wavelength range of 800 to 1000 nm. The maximum $T^{max}_{800-1000}$ is desirably 3% or less, and more desirably 1% or less.

Since the first transmission spectrum of the optical filter 1a satisfies the requirement (iv), the optical filter 1a has a high transmittance in a given wavelength range including longer wavelengths, for example, in the range of 1500 nm to 2000 nm.

The optical filter 1a has a high transmittance in the visible region and a given infrared region of 1500 nm or longer. Therefore, for example, in camera modules installed in digital cameras and mobile terminals such as smartphones, the optical filter 1a can serve as a near-infrared cut filter for blocking light with a wavelength, which is a wavelength outside of a valid range of a visual sensitivity curve of humans, of a portion of infrared. The optical filter 1a may also be applied to a time-of-flight (TOF) type distance measuring instrument, including a distance measuring instrument such as a light detection and ranging (LiDAR) instrument, or its peripheral device. Light, such as laser light, with a wavelength belonging to a near-infrared region around 900 nm is conventionally used when a TOF-type sensor is used, for example, in a LiDAR instrument. However, when light with a wavelength around 900 nm is used, a light receiver such as a sensor may be affected, for example, by sunlight. Since sunlight abundantly includes light with a wavelength of 900 nm, background noise may adversely affect, for example, the distance measurement accuracy.

Therefore, a TOF method in which light, such as laser light, with a wavelength around 1550 nm is used and a LiDAR instrument using the TOF method are under discussion. In a spectrum of sunlight, the light intensity and light quantity at a wavelength of 1550 nm are smaller than those at a wavelength of 900 nm. Accordingly, if a light receiver or an element or the like around the light receiver can be designed to be adapted for light in a wavelength region including a wavelength around 1550 nm for the purpose of using light with a wavelength around 1550 nm, it is hoped that noise by sunlight reduces in a measurement result by a LiDAR instrument even in the daytime and an S/N measured increases.

It is expected that an apparatus in which a camera module for taking an image formed by means of light in the visible region humans can recognize and a TOF-type distance measuring instrument such as a LiDAR instrument are installed or an apparatus in which some of TOF-type distance measurement functions are integrated in a camera module as described above will be produced. An apparatus having a function, for example, that can allow the apparatus to obtain both an image, such as a moving or still image, taken by a camera module as described above or the like and an image including highly accurate distance information obtained by a TOF-type distance measuring instrument, such as a LiDAR instrument, or the like is expected. Moreover, an apparatus having a function for obtaining an image, such as a moving or still image, including detailed distance information is expected. The optical filter 1a applied to such apparatuses can allow transmission of light which is necessary for image formation and which has wavelengths corresponding to the visual sensitivity of humans and transmission of light which is used by a distance measuring instrument and which has a wavelength around 1550 nm or a longer wavelength up to 2000 nm. In addition, the optical filter 1a can block light belonging to ultraviolet and light in the wavelength range of 700 nm to 1000 nm or 700 nm to 1100 nm, and is excellent in convenience, simplicity, and optical properties.

The optical filter 1a blocks a portion of light, for example, by absorption. Because of this, the optical filter 1a is advantageous in reducing occurrence of problematic flare and ghost inside a camera module or a distance measuring instrument.

Strong light, such as laser light or LED light, with a wavelength of 1550 nm has a weaker effect on human eyes than light with a wavelength of 900 nm. For example, according to the laser product safety standards in IEC 60825, standards developed by International Electrotechnical Commission, the maximum permissible exposure (MPE) is $1\times10^{-6}$ J/cm$^2$ for a wavelength of 900 nm and is 1 J/cm$^2$ for a wavelength of 1550 nm at a pulse width of 1 microsecond (μs). As the safety of humans against laser light must be ensured, making it easier to ensure the safety by using light with a wavelength around 1550 nm is advantageous in expanding the range of measurement objects. In a TOF-type distance measuring instrument such as a LiDAR instrument, a distance is measured on the basis of a time-of-flight of light with which, for example, a measurement object is irradiated and which is reflected by the measurement object. In the case where a person holds a TOF-type distance measuring instrument, reflected light from, for example, a measurement object returns to the person. In such a case, the above safety circumstances are thought advantageous in adoption of the optical filter 1a, provided that a TOF-type distance measuring instrument includes a light emitting device or the like emitting light with a wavelength around 1550 nm and the TOF-type distance measuring instrument or the like is placed near an eye, the face, or the upper half of the body of a person or at around the height thereof.

In the first transmission spectrum of the optical filter 1a, the minimum $T^{min}_{1500\text{-}1700}$ is desirably 70% or more, and more desirably 75% or more.

In the first transmission spectrum of the optical filter 1a, the transmittance at a wavelength of 1550 nm is, for example, 70% or more, desirably 80% or more, and more desirably 85% or more.

The first transmission spectrum of the optical filter 1a, for example, further satisfies the following requirement (v). In this case, the first spectrum is likely to be consistent with the visual sensitivity of humans in a wavelength range of 550 nm to 800 nm.

(v) A first cut-off wavelength $\lambda_{C1}$ which lies in a wavelength range of 550 nm to 800 nm and at which the transmittance is 50% is in a range of 600 nm to 700 nm.

The first cut-off wavelength $\lambda_{C1}$ is desirably in a range of 620 nm to 680 nm.

The first transmission spectrum of the optical filter 1a, for example, further satisfies the following requirement (vi). In this case, the optical filter 1a is likely to have a high transmittance in a given infrared region of 1500 nm or longer.

(vi) A second cut-off wavelength $\lambda_{C2}$ which lies in a wavelength range of 1000 nm to 1800 nm and at which the transmittance is 50% is in a range of 1150 nm to 1500 nm.

The second cut-off wavelength $\lambda_{C2}$ is desirably in a range of 1200 nm to 1430 nm.

Moreover, in the first transmission spectrum of the optical filter 1a, an absolute value $|\lambda_{C2}-\lambda_{C1}|$ of a difference between the second cut-off wavelength $\lambda_{C2}$ and the first cut-off wavelength $\lambda_{C1}$ is, for example, 600 nm or more, and may be desirably 650 nm or more, and more desirably 700 nm or more. Furthermore, the value $|\lambda_{C2}-\lambda_{C1}|$ is, for example, 800 nm or less, and may be desirably 780 nm or less, and more desirably 760 nm or less.

The first transmission spectrum of the optical filter 1a, for example, further satisfies the following requirement (vii). In this case, the first spectrum is likely to be consistent with the visual sensitivity of humans in a wavelength range of 350 nm to 450 nm.

(vii) A third cut-off wavelength $\lambda_{C3}$ which lies in a wavelength range of 350 nm to 450 nm and at which the transmittance is 50% is in a range of 360 nm to 430 nm.

Moreover, in the first transmission spectrum of the optical filter 1a, an absolute value $|\lambda_{C1}-\lambda_{C3}|$ of a difference between the first cut-off wavelength $\lambda_{C1}$ and the third cut-off wavelength $\lambda_{C3}$ is, for example, 200 nm or more, and may be desirably 210 nm or more, and more desirably 220 nm or more. Furthermore, the value $|\lambda_{C1}-\lambda_{C3}|$ is, for example, 270 nm or less, and may be desirably 260 nm or less, and more desirably 250 nm or less.

The first transmission spectrum of the optical filter 1a, for example, further satisfies the following requirement (viii). In this case, the optical filter 1a can block a portion of infrared with a wavelength of 1000 nm to 1100 nm.

(viii) A maximum $T^{max}_{1000\text{-}1100}$ of the transmittance in a wavelength range of 1000 nm to 1100 nm is 10% or less.

The maximum $T^{max}_{1000\text{-}1100}$ is desirably 5% or less.

The first transmission spectrum of the optical filter 1a, for example, further satisfies the following requirement (ix). In this case, for example, the optical filter 1a can be used in an apparatus that measures a distance using light in a wavelength range of 1700 nm to 1900 nm.

(ix) A minimum $T^{min}_{1700\text{-}1900}$ of the transmittance in a wavelength range of 1700 nm to 1900 nm is 60% or more.

The minimum $T^{min}_{1700\text{-}1900}$ is desirably 65% or more, and more desirably 70% or more.

The first transmission spectrum of the optical filter 1a, for example, further satisfies the following requirement (x). In this case, for example, the optical filter 1a can be used in an apparatus that measures a distance using light in a wavelength range of 1900 nm to 2200 nm.

(x) A minimum $T^{min}_{1900\text{-}2200}$ of the transmittance in a wavelength range of 1900 nm to 2200 nm is 60% or more.

The minimum $T^{min}_{1900\text{-}2200}$ is desirably 65% or more, and more desirably 70% or more.

As shown in FIG. 1, the optical filter 1a includes, for example, a light-absorbing layer 10. The light-absorbing layer 10 includes a light absorber. The thickness of the light-absorbing layer 10 is not limited to a particular value. The light-absorbing layer 10 has, for example, a thickness of 100 μm to 400 μm. This makes it likely to achieve a low-profile apparatus including the optical filter 1a. The thickness of the light-absorbing layer 10 is desirably 120 μm to 350 μm, and more desirably 140 μm to 300 μm.

The optical filter 1a has, for example, a second transmission spectrum at 70° C., the second transmission spectrum having a fourth cut-off wavelength $\lambda_{C4}$ which lies in the wavelength range of 550 nm to 800 nm and at which the transmittance is 50%. An absolute value $|\lambda_{C4}-\lambda_{C1}|$ of a difference between the fourth cut-off wavelength $\lambda_{C4}$ and the first cut-off wavelength $\lambda_{C1}$ is not limited to a particular value, and is, for example, 15 nm or less. In this case, for the optical filter 1a, a cut-off wavelength being a boundary between a transmission band and a blocking band in the wavelength range of 550 nm to 800 nm is unlikely to vary with changes in an environmental temperature of the optical filter 1a.

The absolute value $|\lambda_{C4}-\lambda_{C1}|$ is desirably 10 nm or less, more desirably 8 nm or less, and even more desirably 5 nm or less.

The optical filter 1a has, for example, a second transmission spectrum at 70° C., the second transmission spectrum having a fifth cut-off wavelength $\lambda_{C5}$ which lies in the wavelength range of 1000 nm to 1800 nm and at which the transmittance is 50%. An absolute value $|\lambda_{C5}-\lambda_{C2}|$ of a difference between the fifth cut-off wavelength $\lambda_{C5}$ and the second cut-off wavelength $\lambda_{C2}$ is not limited to a particular value, and is, for example, 30 nm or less. In this case, for the optical filter 1a, a cut-off wavelength being a boundary between a transmission band and a blocking band in the wavelength range of 1000 nm to 1800 nm is unlikely to vary with changes in the environmental temperature of the optical filter 1a.

The absolute value $|\lambda_{C5}-\lambda_{C2}|$ is desirably 20 nm or less.

The optical filter 1a has, for example, a second transmission spectrum at 70° C., the second transmission spectrum having a sixth cut-off wavelength $\lambda_{C6}$ which lies in the wavelength range of 350 nm to 450 nm and at which the transmittance is 50%. An absolute value $|\lambda_{C6}-\lambda_{C3}|$ of a difference between the sixth cut-off wavelength $\lambda_{C6}$ and the third cut-off wavelength $\lambda_{C3}$ is not limited to a particular value, and is, for example, 15 nm or less. In this case, for the optical filter 1a, a cut-off wavelength being a boundary between a transmission band and a blocking band in the wavelength range of 350 nm to 450 nm is unlikely to vary with changes in the environmental temperature of the optical filter 1a.

The absolute value $|\lambda_{C6}-\lambda_{C3}|$ is desirably 10 nm or less, and more desirably 8 nm or less.

In the first transmission spectrum of the optical filter 1a, an average transmittance in the wavelength range of 1530 nm to 1570 nm is, for example, 70% or more, desirably 75% or more, and more desirably 80% or more. The optical filter having a high transmittance of light in the visible region and a high transmittance of light with a wavelength around 1550 nm is advantageous in obtaining an image including distance information obtained by means of a TOF-type distance measurement function.

In the first transmission spectrum of the optical filter 1a, a ratio Tr (1) of the average transmittance in the wavelength range of 1530 nm to 1570 nm to an average transmittance in the wavelength range of 450 nm to 600 nm is, for example, 0.8 or more, desirably 0.85 or more. The ratio Tr (1) is, for example, 1.2 or less, desirably 1.1 or less.

In the first transmission spectrum of the optical filter 1a, an average transmittance in a wavelength range of 1800 nm to 2100 nm is, for example, 80% or more, desirably 82% or more, and more desirably 85% or more. It is thought that the increase in the transmittance of the optical filter 1a in this wavelength range is attributable to a small amount, in the light-absorbing layer 10, of a functional group absorbing light in the wavelength range of 1800 nm to 2100 nm or a compound having such a functional group.

The optical filter 1a is characterized, for example, by a small absorption in a given wavelength range and a high transmittance in the given wavelength range compared to the optical filter described in Patent Literature 4. The first transmission spectrum of the optical filter 1a may have, for example, local minima (absorption peak) in the wavelength range of 1600 nm to 1800 nm and the wavelength range of 2100 nm to 2200 nm. In this case, the local minimum of the transmittance in the wavelength range of 1600 nm to 1800 nm is, for example, 70% or more, desirably 75% or more in the first transmission spectrum of the optical filter 1a. The minimum of the transmittance in the wavelength range of 2100 nm to 2200 nm is, for example, 70% or more, desirably 75% or more in the first transmission spectrum of the optical filter 1a.

In the first transmission spectrum of the optical filter 1a, a ratio Tr (2) of the minimum of the transmittance in the wavelength range of 1600 nm to 1800 nm to the average transmittance in the wavelength range of 1800 nm to 2100 nm is, for example, or more, desirably 0.85 or more. Moreover, the ratio Tr (2) is, for example, 1.1 or less, desirably 1.0 or less.

In the first transmission spectrum of the optical filter 1a, a ratio Tr (3) of the minimum of the transmittance in the wavelength range of 2100 nm to 2200 nm to the average transmittance in the wavelength range of 1800 nm to 2100 nm is, for example, or more, desirably 0.85 or more. Moreover, the ratio Tr (3) is, for example, 1.1 or less, desirably 1.0 or less.

The material of the light-absorbing layer 10 of the optical filter 1a is not limited to a particular material as long as the first transmission spectrum of the optical filter 1a satisfies the above requirements (i), (ii), (iii), and (iv). The light-absorbing layer 10 may be formed, for example, by curing a given light-absorbing composition. In this case, the light-absorbing composition include, for example, a copper complex, at least one selected from the group consisting of a first alkoxy-containing compound and a hydrolysate of the first alkoxy-containing compound, and at least one selected from the group consisting of a second alkoxy-containing compound and a hydrolysate of the second alkoxy-containing compound. The first alkoxy-containing compound is a compound having two alkoxy groups per molecule. The first alkoxy-containing compound is, for example, a compound capable of being hydrolytically condensed. The second alkoxy-containing compound is a compound having three or four alkoxy groups per molecule. The second alkoxy-containing compound is, for example, a compound capable of being hydrolytically condensed. An optical filter satisfying the above requirements (i), (ii), (iii), and (iv) can be produced by curing such a light-absorbing composition. It is unknown why an optical filter satisfying the above requirements (i), (ii), (iii), and (iv) can be produced by using such a light-absorbing composition. It is thought that addition of the first alkoxy-containing compound and adjustment of the added amount of the first alkoxy-containing compound decrease a functional group or a group of functional groups three-dimensionally bonded to its surrounding atoms, making a structure of a polymer in the layer relatively sparse in process of curing and after the curing. Therefore, it is thought that the amount of a portion of molecules in the layer decreases by evaporation or sublimation, the molecules having a functional group that can exhibit absorption in the infrared region. It is thought that because these molecules or a portion of the functional groups absorb light in the wavelength range of 1500 nm to 2000 nm, the optical filter consequently has a high transmittance in the wavelength range.

A transmission spectrum of a cured product of the light-absorbing composition satisfies, for example, the above requirements (i), (ii), (iii), and (iv). The transmission spectrum of the cured product of the light-absorbing composition may further satisfy at least one of the other requirements described above and satisfied by the first transmission spectrum of the optical filter 1a. In this case, the thickness of the cured product of the light-absorbing composition is, for example, 100 μm to 400 μm.

The copper complex includes, for example, a phosphonic acid and a copper component. The copper complex may be, for example, at least one selected from the group consisting of: a compound including a phosphonic acid having an aryl group and the copper component; and a compound including a phosphonic acid having an alkyl group and the copper component. The copper complex may include both compounds. Since the copper complex includes the phosphonic acid and the copper component, the optical filter can have an increased transmittance in the visible region including the wavelength range of 450 nm to 650 nm and can absorb light including a portion of ultraviolet with a wavelength shorter than the visible region and light with a wavelength longer than 700 nm. Because of this, the transmission spectrum of the optical filter 1a is likely to be consistent with the visual sensitivity of humans. In the light-absorbing layer the copper complex is, for example, enclosed in a transparent substance such as a resin.

When the copper complex is the compound including the phosphonic acid having an aryl group and the copper component, the copper complex is likely to exhibit a function of absorbing chiefly light in the wavelength range of 300 nm to 400 nm and light in the wavelength range of 800 nm to 1000 nm. On the other hand, when the copper complex is the compound including the phosphonic acid having an alkyl group and the copper component, the copper complex is likely to exhibit a function of absorbing chiefly light in the wavelength range of 300 nm to 360 nm and light in the wavelength range of 800 nm to 1100 nm.

Adjusting a ratio between the amount of the compound including the phosphonic acid having an aryl group and the copper component and the amount of the compound including the phosphonic acid having an alkyl group and the copper component in the light-absorbing composition in a given range makes it easy for the optical filter 1a to have an increased transmittance in the wavelength range of 1500 nm to 1700 nm. Additionally, adjusting a ratio between the added amount of the phosphonic acid having an aryl group and the added amount of the phosphonic acid having an alkyl group in the light-absorbing composition in a given range makes it easy for the optical filter 1a to have an increased transmittance in the wavelength range of 1500 nm to 1700 nm.

The phosphonic acid having an aryl group is not limited to a particular phosphonic acid, and is, for example, phenylphosphonic acid, nitrophenylphosphonic acid, hydroxyphenylphosphonic acid, bromophenylphosphonic acid, dibromophenylphosphonic acid, fluorophenylphosphonic acid, difluorophenylphosphonic acid, chlorophenylphosphonic acid, dichlorophenylphosphonic acid, iodophenylphosphonic acid, diiodophenylphosphonic acid, benzylphosphonic acid, bromobenzylphosphonic acid, dibromobenzylphosphonic acid, fluorobenzylphosphonic acid, difluorobenzylphosphonic acid, chlorobenzylphosphonic acid, dichlorobenzylphosphonic acid, dichlorobenzylphosphonic acid, iodobenzylphosphonic acid, or diiodobenzylphosphonic acid.

The phosphonic acid having an alkyl group is not limited to a particular phosphonic acid, and is, for example, a phosphonic acid having an alkyl group and 1 to 8 carbon atoms.

In the light-absorbing composition, a relation of an amount Cf of the phosphonic acid having an aryl group and an amount Cs of the phosphonic acid having an alkyl group is not limited to a particular relation. In the light-absorbing composition, Cf:Cs is, for example, 40:60 to 100:0 and is desirably 50:50 to 100:0 on a mass basis. This makes it easier for the optical filter produced using the light-absorbing composition to have desired transmission properties.

In the light-absorbing composition, a ratio of an amount Cfc to an amount Ctc is not limited to a particular value. The amount Ctc is a total amount of a compound having an alkoxy group and a hydrolysate thereof calculated as complete-hydrolysis-condensation products. The amount Cfc is a total amount of the first alkoxy-containing compound and the hydrolysate thereof calculated as complete-hydrolysis-condensation products. The ratio of the amount Cfc to the amount Ctc is, for example, 0.01 to 0.6 on a mass basis. As described above, it is thought that the first alkoxy-containing compound decreases a functional group or a group of functional groups three-dimensionally bonded to its surrounding atoms, making it likely that the structure of the polymer in the layer is relatively sparse in the process of curing and after the curing. The relatively sparse structure is thought to facilitate removal of a solvent or a by-product. As the ratio of the amount Cfc to the amount Ctc is 0.6 or less, network formation is likely to be promoted in the layer. Consequently, a tack-free light-absorbing layer is formed, and the light-absorbing composition is likely to be cured in a desired state. In addition, the mechanical strength of the cured product of the light-absorbing composition is likely to be so high that the cured product is resistant to a physical or chemical treatment in a subsequent step.

The ratio of the amount Cfc to the amount Ctc is desirably 0.02 to 0.5, and more desirably 0.03 to 0.4 on a mass basis.

The light-absorbing composition may include a curable resin, or may be free of a curable resin. In the light-absorbing composition, a ratio of a solid amount Crs of the curable resin to the amount Ctc of the compound having an alkoxy group and the hydrolysate thereof calculated as complete-hydrolysis-condensation products is not limited to a particular value. The ratio of the solid amount Crs to the amount Ctc is, for example, 0 to 2 on a mass basis. The curable resin can improve the density and the mechanical strength of the light-absorbing layer 10. As the ratio of the solid amount Crs to the amount Ctc is 2 or less, it is possible to prevent the curable resin from hindering the function of the first alkoxy-containing compound to make the structure of the polymer in the layer relatively sparse.

The ratio of the solid amount Crs to the amount Ctc is desirably 0 to 1.5, more desirably 0 to 1.3, and even more desirably 0 to 1.28, on a mass basis. As just described, the amount of the curable resin in the light-absorbing composition may be relatively small.

In the light-absorbing composition, a ratio of the amount Cfc to a sum Ctr is not limited to a particular value. The sum Ctr is a sum of the amount Ctc of the compound having an alkoxy group and the hydrolysate thereof calculated as complete-hydrolysis-condensation products and the solid amount Crs of the curable resin. The amount Cfc is a total amount of the first alkoxy-containing compound and the hydrolysate thereof calculated as complete-hydrolysis-condensation products. The ratio of the amount Cfc to the sum Ctr is, for example, 0.01 to 0.4 on a mass basis. It is thought that this is likely to make the structure of the polymer in the layer relatively sparse in the process of curing and after the curing. As the ratio of the amount Cfc to the sum Ctr is 0.4 or less, a tack-free light-absorbing layer can be formed and the light-absorbing composition is cured in a desired state. The mechanical strength of the cured product of the light-absorbing composition is so high that the cured product is resistant to a physical or chemical treatment in a subsequent step. The ratio of the amount Cfc to the sum Ctr is desirably to 0.35, more desirably 0.02 to 0.3, and even more desirably 0.04 to 0.26, on a mass basis.

In the light-absorbing composition, the first alkoxy-containing compound and the second alkoxy-containing compound each may be, for example, a silicon alkoxide (alkoxysilane) or an alkoxide of a metal such as Ti or Al. An alkoxide having two alkoxy groups per molecule is called a bifunctional alkoxide, an alkoxide having three alkoxy groups per molecule is called a trifunctional alkoxide, and an alkoxide having four alkoxy groups per molecule is called a tetrafunctional alkoxide. Alkoxysilanes having two to four alkoxy groups are respectively called bifunctional to tetrafunctional alkoxysilanes.

Alkoxysilanes undergo hydrolysis and polymerization under a condition where water, an acid catalyst, etc. are present, forming a polymer or an inorganic compound. A tetrafunctional alkoxysilane forms a solid compound represented by $SiO_2$ by hydrolysis and polymerization. A trifunctional alkoxysilane forms a solid compound represented by $R—SiO_{1.5}$ by hydrolysis and polymerization. Incidentally, the term "R-" herein means an organic component. These compounds can form a three-dimensional network. The light-absorbing composition may include at least one selected from the group consisting of a trifunctional alkoxysilane, a hydrolysate of a trifunctional alkoxysilane, a tetrafunctional alkoxysilane, and a hydrolysate of a tetrafunctional alkoxysilane. A bifunctional alkoxysilane has only two reactive functional groups per molecule. It is thought that when the light-absorbing composition includes a bifunctional alkoxysilane, a functional group or a group of functional groups three-dimensionally bonded to its surrounding atoms decreases and the structure of the polymer in the layer is likely to be relatively sparse in the process of curing and after the curing. It is thought that because of this, in the process of curing the light-absorbing composition, a solvent or an acetic acid or alcohol generated by the reaction is likely to be effectively discharged outside. It is thought that, consequently, the amount of a portion of molecules in the layer decreases by evaporation, sublimation, or the like and absorption of light in a given wavelength range in the infrared region can be reduced, the molecules having a functional group that can absorb light in the wavelength range.

The tetrafunctional alkoxysilane is not limited to a particular alkoxysilane, and is, for example, tetramethoxysilane or tetraethoxysilane. The trifunctional alkoxysilane is not limited to a particular alkoxysilane. The trifunctional alkoxysilane is, for example, methyltrimethoxysilane, methyltriethoxysilane, phenyltrimethoxysilane, phenyltriethoxysilane, 3-glycidoxypropyltrimethoxysilane, 3-glycidoxypropyltriethoxysilane, n-propyltrimethoxysilane, n-propyltriethoxysilane, hexyltriethoxysilane, hexyltrimethoxysilane, trifluoropropyltriethoxysilane, trifluoropropyltrimethoxysilane, vinyltriethoxysilane, vinyltrimethoxysilane, 3-aminopropyltriethoxysilane, 3-aminopropyltrimethoxysilane, 3-mercaptopropyltriethoxysilane, 3-mercaptopropyltrimethoxysilane, 3-isocyanatopropyltriethoxysilane, or 3-isocyanatopropyltrimethoxysilane. The bifunctional alkoxysilane is not limited to a particular alkoxysilane. The bifunctional alkoxysilane is, for example, dimethyldiethoxysilane, dimethyldimethoxysilane, diphenyldimethoxysilane, diphenyldiethoxysilane, 3-glycidoxypropyl methyldimethoxysilane, or 3-glycidoxypropyl methyldiethoxysilane.

In the light-absorbing composition, the curable resin may enclose the copper complex. The curable resin may enclose the compound having an alkoxy group, the hydrolysate thereof, or a polymer thereof. In production of the optical filter by curing the light-absorbing composition, the presence of the curable resin is advantageous in that the density of the layer or film formed by curing the light-absorbing composition is improved and the rigidity of the layer or film is easily increased. Meanwhile, adjusting the amount of the curable resin in the light-absorbing composition makes it less likely that the function of the first alkoxy-containing compound to make the structure of the layer appropriately sparse decreases.

The curable resin is not limited to a particular resin. The curable resin is, for example, at least one selected from the group consisting of an epoxy resin, an urethane resin, an acrylic resin, a polyolefin resin, and a silicone resin.

The light-absorbing composition may further include a phosphoric acid ester. In the light-absorbing layer formed using the light-absorbing composition, the compound having an alkoxy group or the hydrolysate thereof can appropriately disperse the copper complex while imparting high moisture resistance to the light-absorbing layer compared to the phosphoric acid ester. Therefore, since the light-absorbing composition includes the compound having an alkoxy group or the hydrolysate thereof, the amount of the phosphoric acid ester used can be decreased. The light-absorbing composition may be free of the phosphoric acid ester.

The phosphoric acid ester is, for example, a phosphoric acid ester having a polyoxyalkyl group. The phosphoric acid ester having a polyoxyalkyl group is not limited to a particular phosphoric acid ester. The phosphoric acid ester having a polyoxyalkyl group is, for example, PLYSURF A208N (polyoxyethylene alkyl (C12, C13) ether phosphoric acid ester), PLYSURF A208F (polyoxyethylene alkyl (C8) ether phosphoric acid ester), PLYSURF A208B (polyoxyethylene lauryl ether phosphoric acid ester), PLYSURF A219B (polyoxyethylene lauryl ether phosphoric acid ester), PLYSURF AL (polyoxyethylene styrenated phenylether phosphoric acid ester), PLYSURF A212C (polyoxyethylene tridecyl ether phosphoric acid ester), or PLYSURF A215C (polyoxyethylene tridecyl ether phosphoric acid ester). All of these are products manufactured by DKS Co., Ltd. The phosphoric acid ester may be, for example, NIKKOL DDP-2 (polyoxyethylene alkyl ether phosphoric acid ester), NIKKOL DDP-4 (polyoxyethylene alkyl ether phosphoric acid ester), or NIKKOL DDP-6 (polyoxyethylene alkyl ether phosphoric acid ester). All of these are products manufactured by Nikko Chemicals Co., Ltd.

As shown in FIG. 1, the optical filter 1a further includes a transparent substrate 20. The transparent substrate 20 has a pair of principal surfaces parallel to each other. In the optical filter 1a, the light-absorbing layer 10 is placed on one of the principal surfaces of the transparent substrate 20. The optical filter 1a may be modified such that the light-absorbing layer 10 is placed on each principal surface of the transparent substrate 20. The light-absorbing layer 10 can be formed, for example, by applying the above light-absorbing composition to one principal surface or each principal surface of the transparent substrate 20 and curing the applied light-absorbing composition. The light-absorbing layer 10 and the principal surface of the transparent substrate 20 may be in contact with each other. As long as the first transmission spectrum of the optical filter 1a satisfies the above requirements (i), (ii), (iii), and (iv), an additional functional layer may be arranged between the light-absorbing layer 10 and the principal surface of the transparent substrate 20. The additional functional layer is not limited to a particular layer, and is, for example, a layer for improving the adhesion between the light-absorbing layer 10 and the transparent substrate 20 or a layer other than one obtained by curing the above light-absorbing composition. The degree of the transparency of the transparent substrate 20 is not limited to a particular degree as long as the first transmission spectrum of the optical filter 1a satisfies the above requirements (i), (ii), (iii), and (iv). For example, a substrate having a transmittance of 75% or more in the wavelength range of 400 nm to 700 nm when having a thickness of 0.2 mm can be used as the transparent substrate 20. Moreover, the transparent substrate 20 may be a substrate showing a transmission spectrum in which the transmittance is 75% or more in the wavelength range of 1400 nm to 2200 nm.

The transparent substrate 20 is not limited to a particular substrate. The transparent substrate 20 may be a transparent glass substrate including glass or a transparent resin substrate including a resin. Transparent glass substrates have a high transparency and an extremely smooth principal surface and are available at very low prices. Moreover, transparent glass substrates, which have a high hardness and a high Young's modulus, can fully withstand a manufacturing process or distribution even with a small thickness. Transparent resin substrates have a high transparency, are light in weight, and are suitable for various production methods. When the transparent substrate 20 is a transparent resin substrate, for example, substrates in various shapes can be supplied at low prices. The material of the transparent resin substrate is not limited to a particular material. The material of the transparent resin substrate is, for example, an epoxy resin, an urethane resin, an acrylic resin, a polyethylene resin, a polyethylene terephthalate resin, a polypropylene resin, a polyolefin resin, a polyamide resin, a polyimide resin, a polyvinyl chloride resin, a polystyrene resin, or a silicone resin.

The optical filter 1a may be modified to have a configuration in which the light-absorbing layer is provided on a surface of an optical element such as a lens, a diffraction grating, or a polarizer. For example, the optical filter including the light-absorbing layer and an optical element such as a lens can be provided by applying the above light-absorbing composition onto a surface of the optical element and curing the applied light-absorbing composition. For example, in the case where the optical filter is configured to include at least one lens of a lens system to be included in a camera module, it is possible to allow light having a desired transmission spectrum to be incident on an imaging sensing device without placing a separately produced optical filter. As just described, for example, an optical filter having both a function inherent to an optical element and a light-absorbing function can be provided by forming the light-absorbing layer 10 on at least one surface of a functional optical element. Examples of the optical element is not limited to the above elements. The material of the optical element is not limited to a particular material, and examples of the material of the optical element can include materials described as examples of the material of the transparent substrate 20.

Figure 2:
FIG. 2 is a cross-sectional view showing another example of the optical filter according to the present invention.

The optical filter 1a may be modified to an optical filter 1b shown in FIG. 2. The optical filter 1b is a film-shaped filter including the light-absorbing layer 10. The optical filter 1b can be obtained, for example, by applying the above light-absorbing composition onto a smooth principal surface of a substrate, curing the applied light-absorbing composition to form the light-absorbing layer 10, and separating the light-absorbing layer from the substrate. The smooth principal surface of the substrate is configured so that the optical filter 1b will satisfy the above requirements (i), (ii), (iii), and (iv). The above transparent substrate 20 may be used as the substrate for manufacturing the optical filter 1b, or a metal substrate or a ceramic substrate may be used as the substrate for manufacturing the optical filter 1b. The optical filter 1b is a film-shaped filter, and is configured as a substrate-less filter. Because of this, the optical filter 1b is suitable for reduction in thickness and is likely to decrease the cost of manufacturing the optical filter 1b. The optical filter 1b may be obtained by peeling the light-absorbing layer 10 off the substrate after formation of the light-absorbing layer 10 on the substrate. The smooth principal surface of the substrate may be coated with a fluorine resin before the application of the light-absorbing composition to the substrate. This makes it easy to peel the light-absorbing layer 10 off the substrate.

The optical filter may be obtained by applying the above light-absorbing composition on a substrate having a curved surface or a surface having a lattice structure or irregularities, curing the applied light-absorbing composition to obtain the light-absorbing layer 10, and separating the light-absorbing layer 10 from the substrate. In this case, the light-absorbing layer 10 is formed to conform to the surface of the substrate and therefore has a shape reflecting the surface of the substrate. Accordingly, the optical filter having characteristics in accordance with those of the surface of the substrate can be produced.

The optical filters 1a or 1b may be modified to further include, in addition to the light-absorbing layer 10, an antireflection film or a reflection reduction film reducing the reflectance of visible light or light with a wavelength of 1500 nm or longer. This is likely to increase the light quantity of visible light or light with a wavelength of 1500 nm or longer, the light reaching an imaging sensing device. When the optical filter further includes the antireflection film or the reflection reduction film, for example, the reflectance of light reflected by the optical filter can be less than 5%.

The antireflection film or the reflection reduction film is formed, for example, on at least one surface of the light-absorbing layer 10 so as to have one or more layers formed of one or more materials. The material of the antireflection film or the reflection reduction film is not limited to a particular material. The antireflection film or the reflection reduction film may be, for example, a film formed by a sol-gel process or the like and including $SiO_2$ or $SiO_{1.5}$ as a main component or a film including $SiO_2$ or $SiO_{1.5}$ as a main component in which fine hollow particles or fine particles of a low refractive index material are dispersed. The antireflection film or the reflection reduction film may be a film including $TiO_2$, $Ta_2O_5$, $SiO_2$, $Nb_2O_5$, ZnS, MgF, or a mixture thereof and formed by a method such as deposition, sputtering, or ion plating. The deposition may be ion beam-assisted deposition. The antireflection film or the reflection reduction film may be a single-layer film including any of the above materials or a multilayer film in which films of different materials are alternately stacked. Moreover, the antireflection film or the reflection reduction film may be arranged in contact with the light-absorbing layer 10, or may be arranged in contact with the additional functional layer arranged in contact with the light-absorbing layer 10.

The optical filter 1a or 1b may include, in addition to the light-absorbing layer 10, a film, namely, a light-reflecting film, having a high reflectance of light in the range of wavelengths to be blocked. In this case, the optical filter may satisfy, in conjunction with the light-absorbing layer 10 and the light-reflecting film, the above requirements related to the transmission spectra. For example, the thickness of the light-absorbing layer 10 can be reduced by effective adjustment of a spectrum of the light-reflecting film. The light-reflecting film can be formed, for example, on at least one surface of the light-absorbing layer 10 so as to have one or more layers formed of one or more materials. The material of the light-reflecting film is not limited to a particular material. The light-reflecting film may be, for example, a film formed by a sol-gel process or the like and including $SiO_2$ or $SiO_{1.5}$ as a main component or a film including $SiO_2$ or $SiO_{1.5}$ as a main component in which fine hollow particles or fine particles of a low refractive index material are dispersed. The light-reflecting film may be a film including $TiO_2$, $Ta_2O_3$, $SiO_2$, $Nb_2O_5$, ZnS, MgF, or a mixture thereof and formed by a method such as deposition, sputtering, or ion plating. The deposition may be ion beam-assisted deposition. The light-reflecting film may be a single-layer film including any of the above materials or a multilayer film in which films of different materials are alternately stacked. The light-reflecting film may be arranged in contact with the light-absorbing layer 10, may be arranged in contact with the additional functional layer arranged in contact with the light-absorbing layer 10, or may be arranged in contact with at least one principal surface of the transparent substrate 20.

The optical filter according to the present invention is not limited to the above embodiment, the above features of the optical filter may be combined as appropriate, unless there is technical inconsistency.

Figure 3:
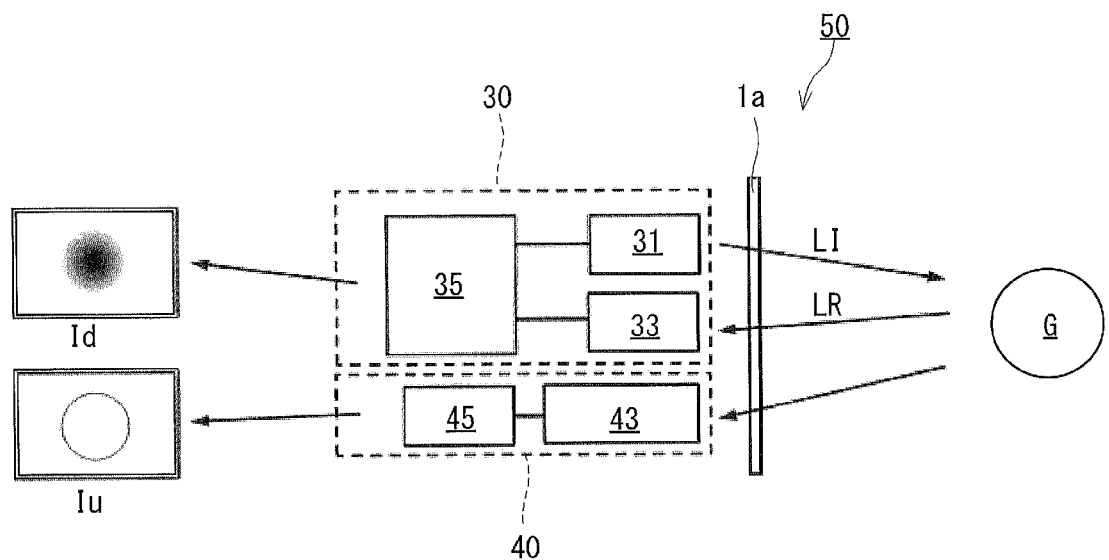
FIG. 3 is a block diagram showing an apparatus including the optical filter according to the present invention.
Figure 4:
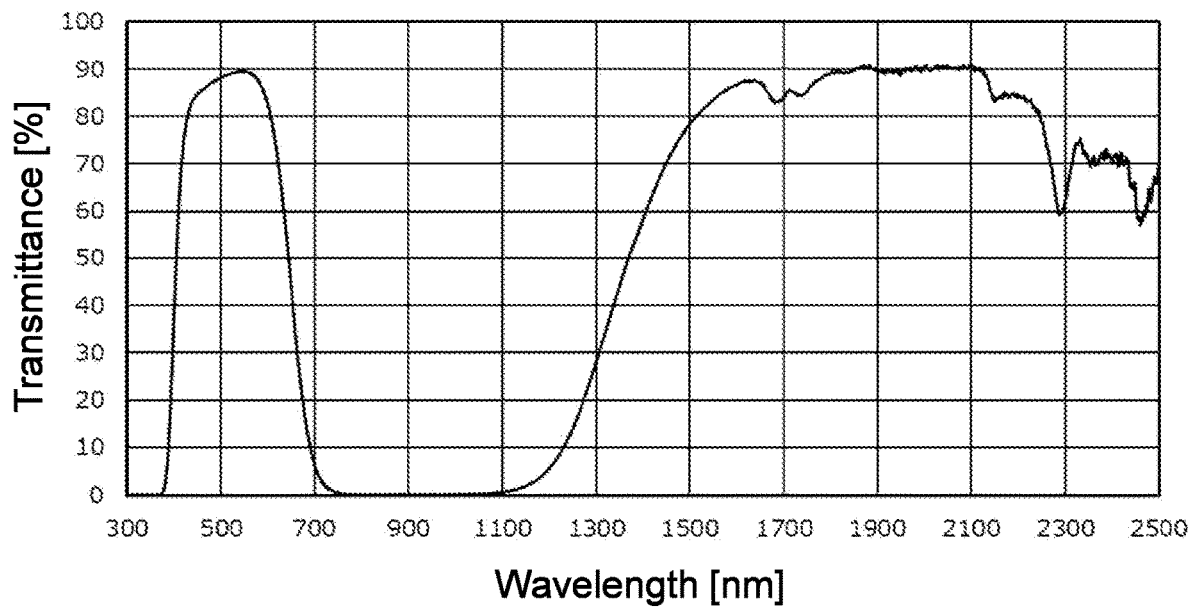
FIG. 4 shows a transmission spectrum of an optical filter according to Example 1.
Figure 5:
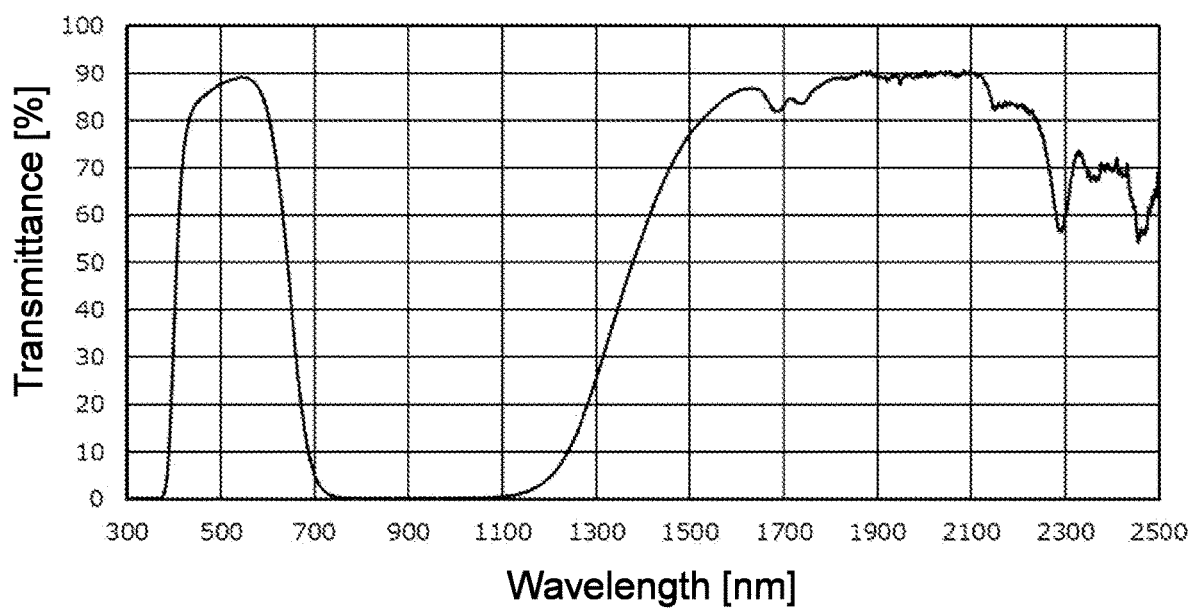
FIG. 5 shows a transmission spectrum of an optical filter according to Example 2.
Figure 6:
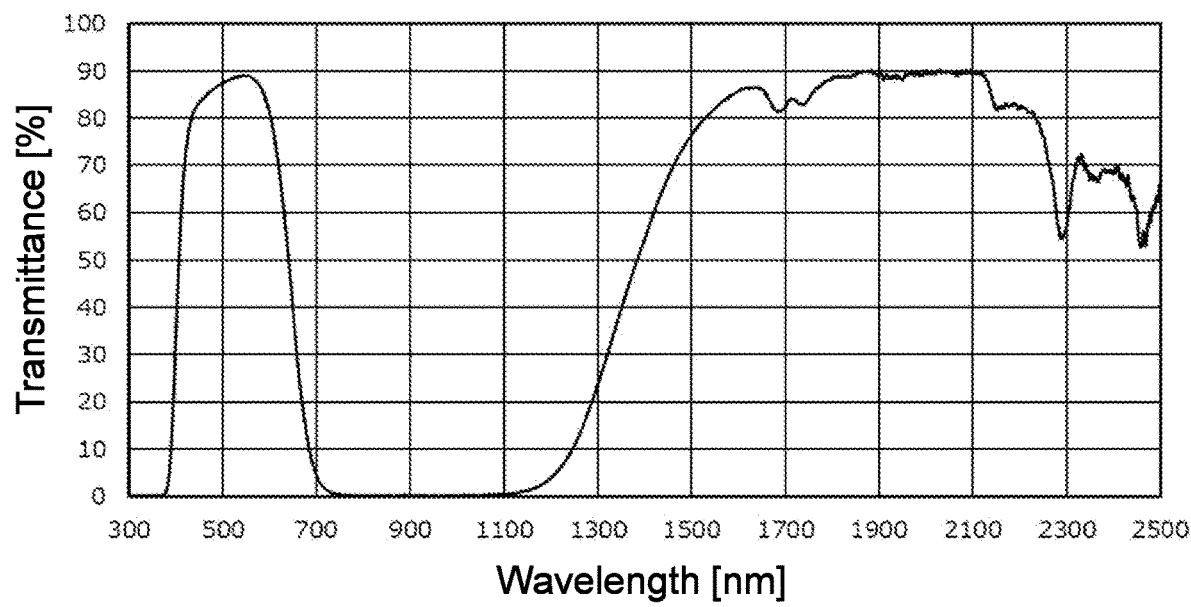
FIG. 6 shows a transmission spectrum of an optical filter according to Example 6.
Figure 7:
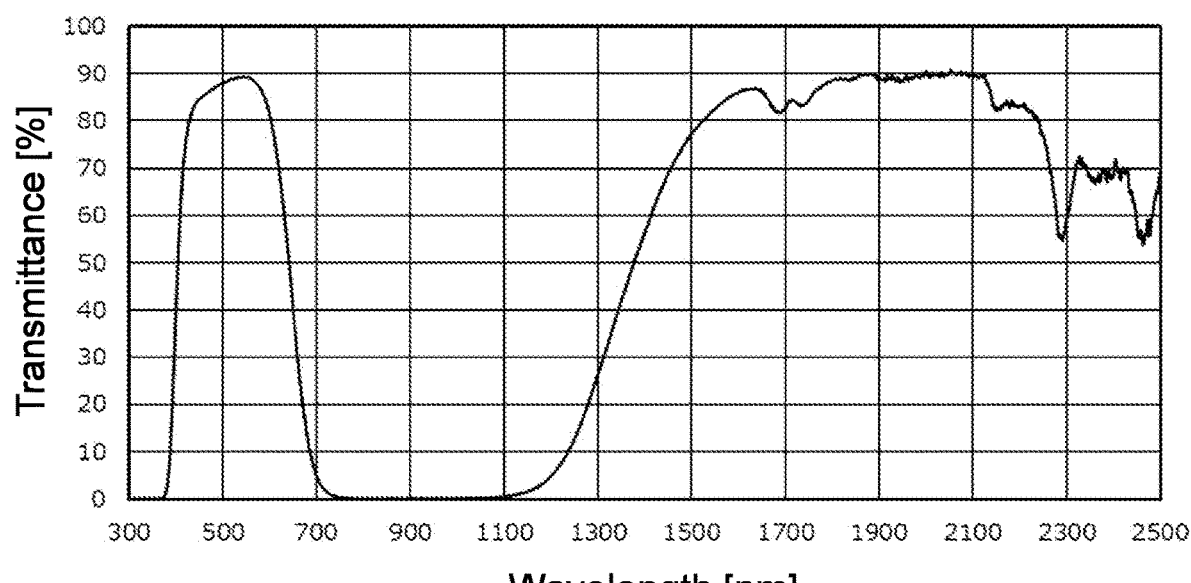
FIG. 7 shows a transmission spectrum of an optical filter according to Example 7.

For example, an apparatus 50 shown in FIG. 3 can be provided using the optical filter 1a. The apparatus 50 includes, for example, a TOF sensor portion 30 and a camera module portion 40 in addition to the optical filter 1a. The camera module portion is a part for recognizing light in the visible region or the infrared region and forming an image. The camera module portion 40 obtains, for example, image information recognized by means of visible light or light in the infrared region. FIG. 3 illustrates only minimum parts and functions necessary for description. The apparatus 50 may include an additional part.

The TOF sensor portion 30 obtains, for example, distance measurement information on a distance from an object. The TOF sensor portion 30 includes, for example, an irradiator 31, a light receiver 33, and a controller 35. The irradiator 31 emits light with a wavelength around 1550 nm or a wavelength included in the wavelength range of 1500 nm to 2200 nm as illuminating light LI to irradiate a measurement object G. The light receiver 33 receives reflected light LR from the measurement object G. The wavelength of the reflected light LR can be included in the wavelength range of 1500 nm to 2200 nm. The controller 35 controls the irradiator 31 and the light receiver 33. A distance measurement information image Id can be obtained as an output image from the TOF sensor portion 30. In the distance measurement information image Id, for example, a difference between distances to the measurement object G is expressed by shades of color or color differences.

The irradiator 31 includes, for example, a light-emitting element and an optical element. The light-emitting element is an element, such as a laser or an LED, that emits light with a wavelength included in the above range. The optical element is an element for irradiating the measurement object G with light from the light-emitting element. The optical element included in the irradiator 31 may include a plurality of lenses, a refractor or a deflector such as a prism, a diffusing element for diffusing light, or the like. Illustration of the light-emitting element and the optical element of the irradiator 31 is omitted in FIG. 3.

The light receiver 33 includes, for example, an optical element and a light receiving element. The optical element is an element for receiving light such as the reflected light LR from the measurement object G. The optical element included in the light receiver 33 may include a plurality of lenses, a refractor or a deflector such as a prism, a diffusing element for diffusing light, or the like. The optical element collects light such as the reflected light LR from the measurement object G to the light receiving element. The light receiving element may be a CCD or CMOS image sensor or an avalanche photodiode (APD). Illustration of the optical element and the light receiving element of the light receiver 33 is omitted in FIG. 3.

The camera module portion 40 obtains an image of an object irradiated with reference light. The reference light may be sunlight or light with which an illuminator placed around the camera module irradiates an object, the light belonging to the infrared region. The camera module portion 40 includes, for example, a camera module 43 and a controller 45 for controlling the camera module 43. The camera module 43 includes, for example, an optical element and a light receiving element. The optical element is an element for receiving light from an object. The controller 45 controls, for example, the optical element and the light receiving element. An output image from the camera module portion 40 is, for example, a normal image Iu of the object shown in FIG. 3. The normal image Iu can be an image including the shape, color, and the like of the object that can be recognized by means of visible light. When light belonging to infrared light is used as the reference light, the apparatus 50 can serve as a night-vision camera. However, this case sometimes requires attention to an overlap between a wavelength region of light used in the TOF sensor portion 30 and a wavelength region of the reference light or noise attributed to the overlap.

The optical element included in the camera module 43 may include a plurality of lenses, a refractor or deflector such as a prism, or the like. The optical element collects light from an object to the light receiving element included in the camera module 43. The light receiving element may be a CCD or CMOS image sensor. Illustration of the optical element and the light receiving element of the camera module 43 is omitted in FIG. 3.

As shown in FIG. 3, the optical filter 1a is placed, for example, between the light receiver 33 of the TOF sensor portion 30 and the measurement object G and between the camera module 43 and the measurement object G. The optical filter 1a may be placed between the irradiator 31 of the TOF sensor portion 30 and the measurement object G, the light receiver 33 and the measurement object G, and the camera module 43 and the measurement object G. In other words, the optical filter 1a may be placed in front of a device including the TOF sensor portion 30 and the camera module 43. The optical filter 1a, for example, can allow transmission of light with a wavelength belonging to the visible region and light with a wavelength around 1550 nm or a wavelength in the wavelength range of 1500 nm to 2200 nm at a high transmittance and can block ultraviolet and light in the wavelength range of 700 nm to 1100 nm. Because of this, the optical filter 1a by itself can allow only light with a wavelength necessary for the TOF sensor portion 30 and the camera module portion 40 to exhibit their functions.

It is expected that devices as described above in which both a TOF sensor and a camera module are installed will increase in number. For example, it is expected that both a TOF sensor and a camera module will be installed in smartphones and tablet terminals. Since these devices are small and thin, the TOF sensor and the camera module can be placed close to each other. With the optical filter 1a, a simple configuration can be achieved in the vicinity of the TOF sensor and the camera module.

The apparatus 50 may further include a cover glass (not illustrated) for protecting the apparatus 50. This cover glass may be placed in front of the optical filter 1a, namely, closer to the measurement object G than the optical filter 1a is. The cover glass can protect the optical filter 1a, the TOF sensor portion 30, and the camera module portion 40 against an external shock or a temperature variation. It should be noted that the optical filter 1a can be produced by forming the light-absorbing layer 10, for example, on the transparent substrate 20 that is hard and formed of, for example, a rigid glass or sapphire. Since sapphire, for example, is especially hard, the optical filter 1a having a protective function as well can be provided, for example, by placing the optical filter 1a such that the principal surface, on which the light-absorbing layer 10 is arranged, of the transparent substrate 20 faces the camera module.

EXAMPLES

The present invention will be described in more detail by examples. The present invention is not limited to the examples given below.

Example 1

An amount of 4.500 g of copper acetate monohydrate and 240 g of tetrahydrofuran (THF) were mixed, and were stirred for 3 hours to obtain a copper acetate solution. To the obtained copper acetate solution was added 1.646 g of PLYSURF A208N (manufactured by DKS Co., Ltd.) which is a phosphoric acid ester compound, and the mixture was stirred for 30 minutes to obtain a solution A1. An amount of 40 g of THF was added to 0.706 g of phenylphosphonic acid, and the mixture was stirred for 30 minutes to obtain a solution B1α. An amount of 40 g of THF was added to 4.230 g of 4-bromophenylphosphonic acid, and the mixture was stirred for 30 minutes to obtain a solution B1β. Next, the solution B1α and the solution B1β were mixed, and were stirred for 1 minute. An amount of 8.664 g of methyltriethoxysilane (MTES) (manufactured by Shin-Etsu Chemical Co., Ltd.; product name: KBE-13) and 2.840 g of tetraethoxysilane (TEOS) (manufactured by KISHIDA CHEMICAL Co., Ltd.; special grade) were added to the solution mixture. The resulting mixture was further stirred for 1 minute to obtain a solution B1. The solution B1 was added to the solution A1 while the solution A1 was being stirred, and the resulting mixture was stirred at room temperature for 1 minute. To the resulting solution was then added 100 g of toluene, and the mixture was stirred at room temperature for 1 minute to obtain a solution C1. This solution C1 was put in a flask and subjected to solvent removal using a rotary evaporator (manufactured by Tokyo Rikakikai Co., Ltd.; product code: N-1110SF) under heating by means of an oil bath (manufactured by Tokyo Rikakikai Co., Ltd.; product code: OSB-2100). The temperature of the oil bath was controlled to 105° C. Subsequently, a solution D1 having undergone the solvent removal was taken out of the flask. The solution D1 containing a light-absorbing compound including a phosphonic acid having an aryl group and a copper component was obtained in this manner.

An amount of 4.500 g of copper acetate monohydrate and 240 g of THF were mixed, and were stirred for 3 hours to obtain a copper acetate solution. Next, 2.573 g of PLYSURF A208N being a phosphoric acid ester compound was added to the copper acetate solution, and the mixture was stirred for 30 minutes to obtain a solution E1. An amount of 40 g of THF was added to 2.885 g of n-butylphosphonic acid, and the mixture was stirred for 30 minutes to obtain a solution F1. The solution F1 was added to the solution E1 while the solution E1 was being stirred, and the mixture was stirred at room temperature for 1 minute. To the resulting solution was then added 100 g of toluene, and the mixture was stirred at room temperature for 1 minute to obtain a solution G1.

The solution G1 was put in a flask and subjected to solvent removal using a rotary evaporator under heating by means of an oil bath. The temperature of the oil bath was controlled to 105° C. Subsequently, a solution H1 having undergone the solvent removal was taken out of the flask. The solution H1 containing a light-absorbing compound including a phosphonic acid having an alkyl group and a copper component was obtained in this manner.

The solutions D1 and H1 were mixed such that the relation Cf:Cs between the amount Cf of the phosphonic acid having an aryl group and the amount Cs of the phosphonic acid having an alkyl group was 71:29 on a mass basis. Furthermore, a curable resin (manufactured by Shin-Etsu Chemical Co., Ltd.; product name: KR-300), a catalyst (manufactured by Shin-Etsu Chemical Co., Ltd.; product name: CAT-AC), methyltriethoxysilane (MTES) (manufactured by Shin-Etsu Chemical Co., Ltd.; product name: KBE-13) as a trifunctional alkoxysilane, tetraethoxysilane (TEOS) (manufactured by KISHIDA CHEMICAL Co., Ltd.; special grade) as a tetrafunctional alkoxysilane, and dimethyldiethoxysilane (DMDES) (manufactured by Shin-Etsu Chemical Co., Ltd.; product name: KBE-22) as a bifunctional alkoxysilane respectively in amounts shown in Table 1 were mixed. This mixture was stirred for 30 minutes to obtain a light-absorbing composition according to Example 1. Table 2 shows the solid amounts of the alkoxysilanes each calculated as a complete-hydrolysis-condensation product and the solid amount of the curable resin in the light-absorbing composition according to Example 1. Table 1 also shows mixed (added) amounts of raw materials for other Examples and Comparative Example, the amounts being determined chiefly at the time of mixing or production of light-absorbing compositions.

An amount of 0.1 g of an anti-smudge surface coating agent (manufactured by DAIKIN INDUSTRIES, LTD.; product name: OPTOOL DSX, concentration of active ingredient: 20 mass %) and 19.9 g of a hydrofluoroether-containing solution (manufactured by 3M Company; product name: Novec 7100) were mixed and stirred for 5 minutes to prepare a fluorine treatment agent (concentration of active ingredient: 0.1 mass %). This fluorine treatment agent was applied to one principal surface of a borosilicate glass (manufactured by SCHOTT AG; product name: D 263 T eco) having dimensions of 130 mm×100 mm×0.70 mm. After that, the glass substrate was left at room temperature for 24 hours to dry the coating film of the fluorine treatment agent. The glass surface was then wiped lightly with a dust-free cloth impregnated with Novec 7100 to remove an excess of the fluorine treatment agent. A fluorine-treated substrate was produced in this manner.

The light-absorbing composition according to Example 1 was applied with a dispenser to an 80 mm×80 mm region at a central portion of the one principal surface of the fluorine-treated substrate to form a coating film. The obtained coating film was fully dried at room temperature, and then placed in an oven. The solvent and a by-product were removed while the temperature inside the oven was increased in the range of room temperature to 45° C. over 6 hours. Moreover, removal of the solvent and the by-product was further performed while the temperature inside the oven was increased from 45° C. to over 8 hours. After that, the coating film was peeled off the fluorine-treated substrate. The obtained film was placed in an environment at a temperature of 85° C. and a relative humidity of 85% for additional 24 hours for post curing, and the reaction was completed. After dried to some degree, the film was peeled off the substrate. The solvent, the by-product, etc. remaining in the film were able to be removed while the reaction further proceeded. The light-absorbing composition according to Example 1 included the given amounts of the hydrolyzable alkoxysilanes. The post curing conditions were set for promoting hydrolysis and polymerization of the alkoxysilanes, polymer bonding, etc. An optical filter according to Example 1 was obtained in this manner.

Examples 2 to 7

Light-absorbing compositions according to Examples 2 to 7 were obtained in the same manner as in Example 1, except that the added amount of each raw material was adjusted as shown in Table 1. Optical filters according to Examples 2 to 7 were obtained in the same manner as in Example 1, except that the light-absorbing compositions according to Examples 2 to 7 were respectively used instead of the light-absorbing composition according to Example 1.

Example 8

A light-absorbing composition according to Example 8 was obtained in the same manner as in Example 1, except that dimethyldimethoxysilane (DMDMS) (manufactured by Shin-Etsu Chemical Co., Ltd.; product name: KBM-22) was used as the bifunctional alkoxysilane and the added amount of each raw material was adjusted as shown in Table 1.

The light-absorbing composition according to Example 8 was applied with a dispenser to a 80 mm×80 mm region at a central portion of one principal surface of a borosilicate glass (manufactured by SCHOTT AG; product name: D263 T eco) having dimensions of 130 mm×100 mm×0.70 mm to form a coating film. The obtained coating film was fully dried at room temperature, and then placed in an oven. The solvent and a by-product were removed while the temperature inside the oven was increased in the range of room temperature to 45° C. over 6 hours. Moreover, removal of the solvent and the by-product was further performed while the temperature inside the oven was increased from 45° C. to 85° C. over 8 hours. After that, the coating film was placed in an environment at a temperature of 85° C. and a relative humidity of 85% for 24 hours for post curing, and the reaction was completed. An optical filter according to Example 8 including a light-absorbing layer as well as a glass substrate as a transparent substrate was obtained in this manner.

Examples 9 to 21

Light-absorbing compositions according to Examples 9 to 21 were obtained in the same manner as in Example 1, except that the added amount of each raw material was adjusted as shown in Table 1. Optical filters according to Examples 9 to 21 were obtained in the same manner as in Example 1, except that the light-absorbing compositions according to Examples 9 to 21 were respectively used instead of using the light-absorbing composition according to Example 1.

Comparative Example 1

A light-absorbing composition according to Comparative Example 1 was obtained in the same manner as in Example 1, except that the added amount of each raw material was adjusted as shown in Table 1. An optical filter according to Comparative Example 1 was obtained in the same manner as in Example 1, except that the light-absorbing composition according to Comparative Example 1 was used instead of using the light-absorbing composition according to Example 1.

<Measurement of Transmission Spectrum>

Figure 8:
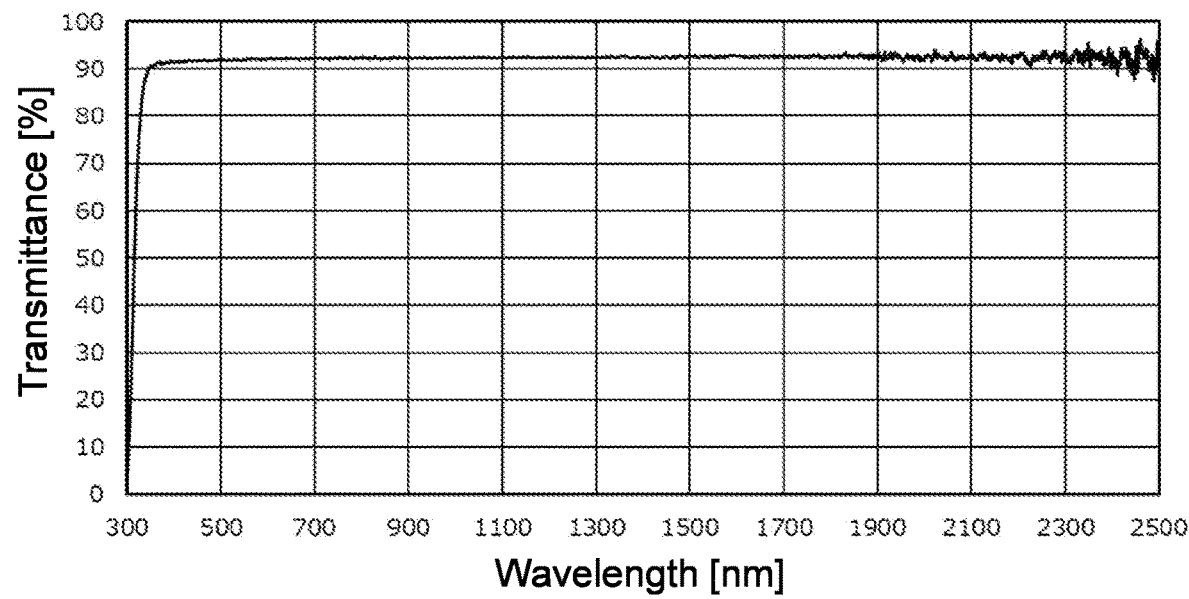
FIG. 8 shows a transmission spectrum of a transparent glass substrate.
Figure 9:
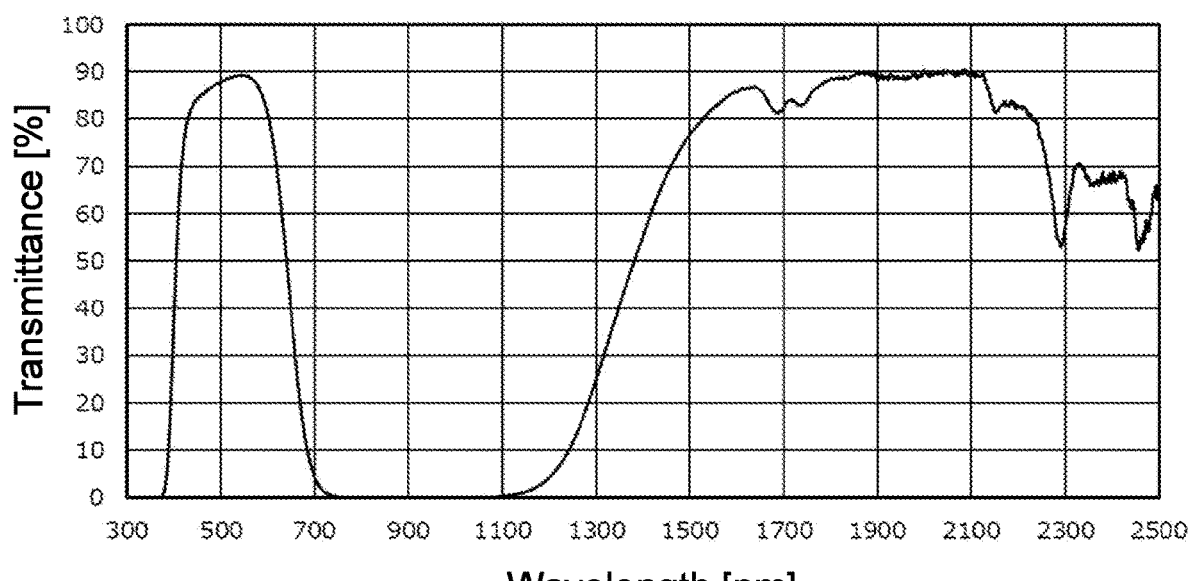
FIG. 9 shows a transmission spectrum of an optical filter according to Example 8.
Figure 10:
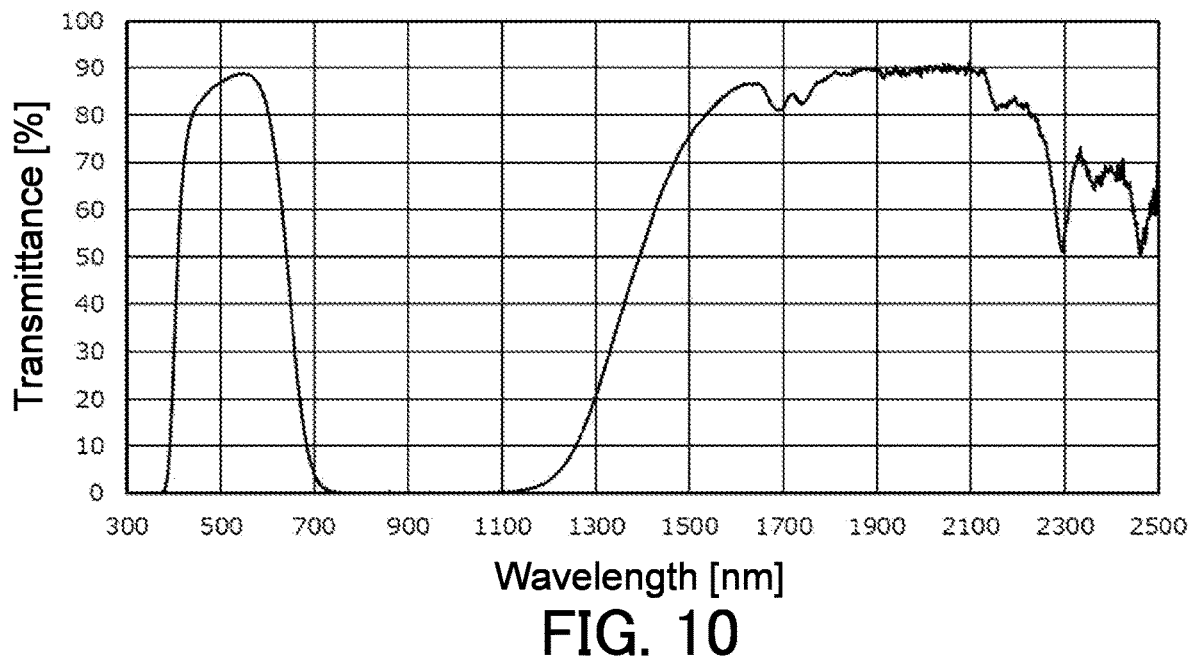
FIG. 10 shows a transmission spectrum of an optical filter according to Example 11.

The optical filters according to Examples 1 to 15, the optical filters according to Examples 17 to 21, and the optical filter according to Comparative Example 1 were measured for a transmission spectrum at an incident angle of 0° using an ultraviolet-visible-near-infrared spectrophotometer V-770 manufactured by JASCO Corporation. Each transmission spectrum was measured by setting the temperature of the environment around the optical filter at 25° C. unless otherwise specified. FIGS. 4, 5, 6, 7, 9, 10, 12, and 13 show the results of measuring the transmission spectra of the optical filters according to Examples 1, 2, 6, 7, 8, 11, 19, and 20, respectively. Moreover, Tables 3 and 4 show several properties related to wavelengths and transmittances and determined from the results of measuring the transmission spectra of the optical filters according to Examples and Comparative Example 1. Additionally, a borosilicate glass substrate as used in Example 8 as a transparent substrate was measured independently for a transmission spectrum in the same manner at an incident angle of 0°. FIG. 8 shows the result. As shown in FIG. 8, the glass substrate has a transmittance of 90% or more at least in the wavelength range of 360 nm to 2500 nm.

Figure 11:
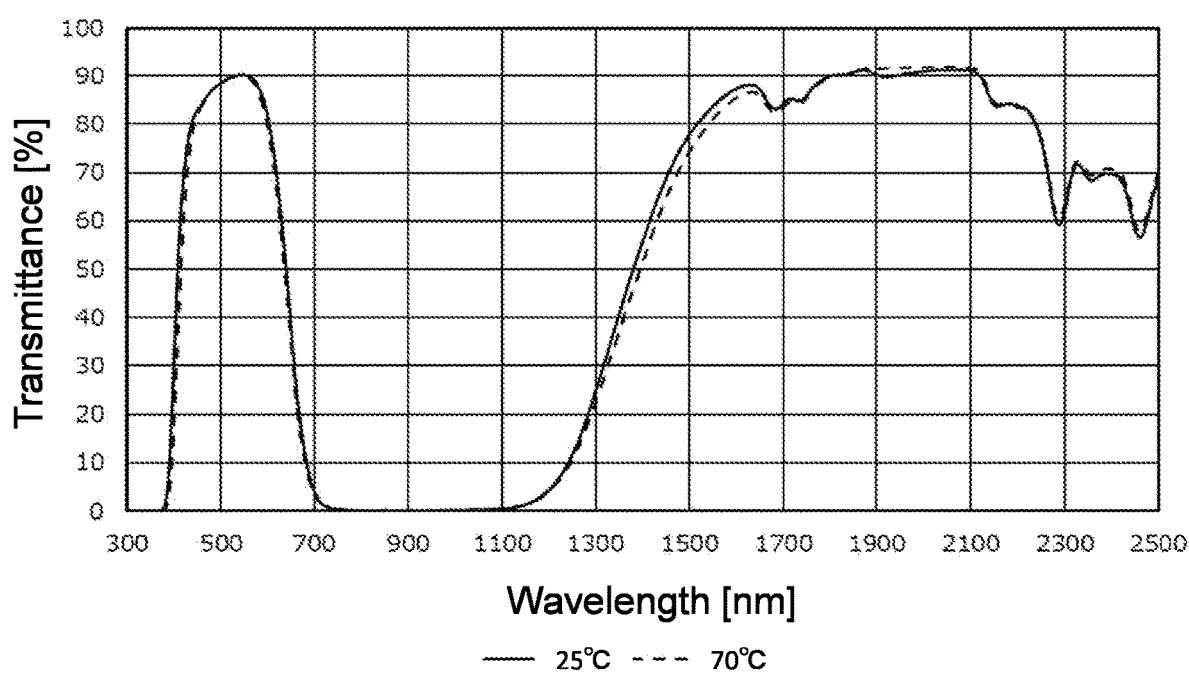
FIG. 11 shows a transmission spectrum of an optical filter according to Example 16.
Figure 12:
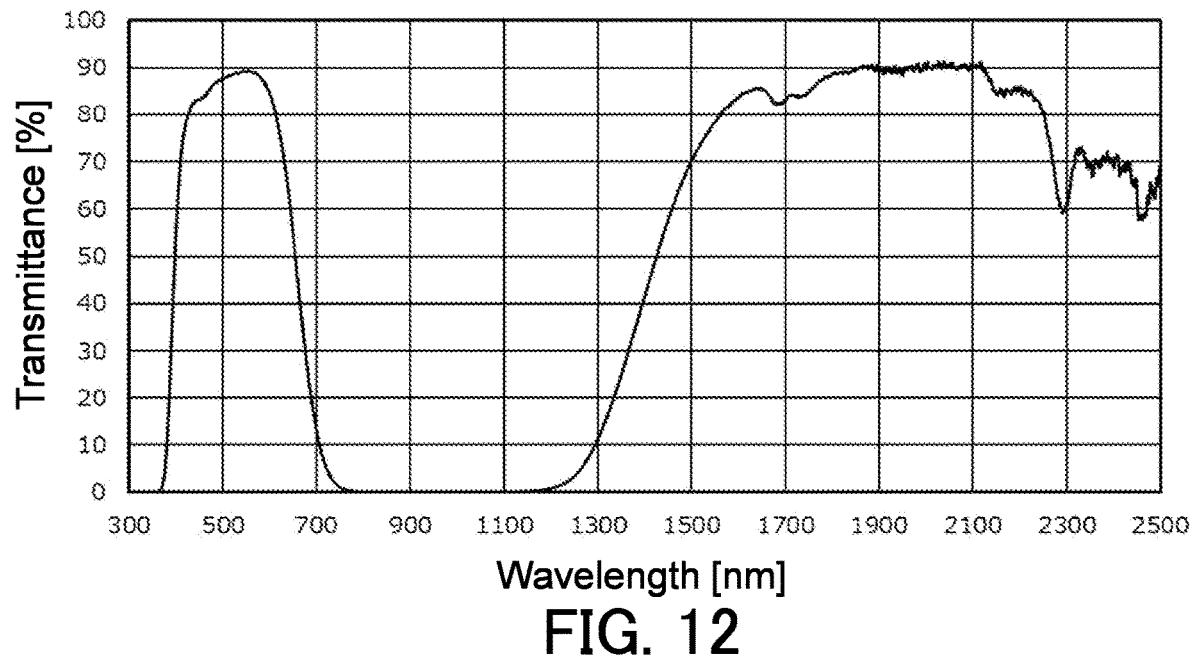
FIG. 12 shows a transmission spectrum of an optical filter according to Example 19.
Figure 13:
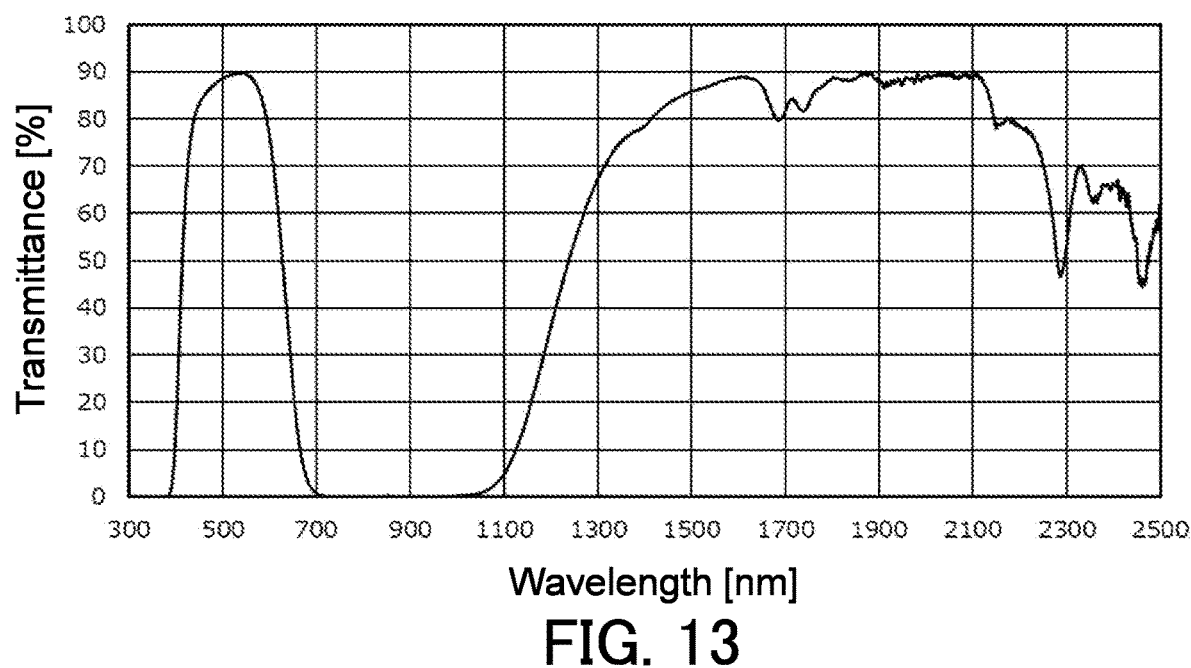
FIG. 13 shows a transmission spectrum of an optical filter according to Example 20.

The optical filter according to Example 16 was set inside a compact constant-temperature chamber manufactured by OPTOQUEST CO., LTD., and the temperature inside the compact constant-temperature chamber was controlled at 25° C. A transmission spectrum of the optical filter according to Example 16 at an incident angle of was measured in this state using an ultraviolet-visible spectrophotometer U-4100 manufactured by Hitachi, Ltd. Moreover, a transmission spectrum of the optical filter according to Example 16 at an incident angle of 0° was measured in the same manner in a state where the temperature inside the compact constant-temperature chamber was controlled at 70° C. FIG. 11 shows the transmission spectra according to Example 16 at the temperatures. In FIG. 11, a solid line represents the transmission spectrum at 25° C. and a broken line represents the transmission spectrum at 70° C. Tables 3 and 4 show several properties related to wavelengths and transmittances and determined from the results of measuring the transmission spectra of the optical filter according to Example 16.

<Thickness Measurement>

Thicknesses of the optical filters according to Examples and Comparative Example 1 were measured using a laser displacement meter LK-H008 manufactured by Keyence Corporation. FIG. 3 shows the results. As to the thicknesses of the optical filter according to Example 8, the thickness of the glass substrate is not taken into account.

As shown in Table 3, the optical filters according to Examples satisfy the above requirements (i), (ii), (iii), (iv), (v), (vi), (vii), (viii), (ix), and (x). It is understood from the optical filter according to Example 8 that a desired optical filter can be obtained even when the light-absorbing composition does not include a curable resin. On the other hand, the optical filter according to Comparative Example 1 does not satisfy the requirement (ii).

For the optical filters according to Example 21 and Comparative Example 1, the minima of the transmittance in the wavelength range of 1500 nm to 1700 nm were lower than those for the optical filters according to Examples 1 to 20. This indicates that in terms of increasing the minimum of the transmittance in the wavelength range of 1500 nm to 1700 nm, it is advantageous for the amount Cf of the phosphonic acid having an aryl group and the amount Cs of the phosphonic acid having an alkyl group in the light-absorbing composition to satisfy the relation of Cf:Cs=50:50 to 100:0 on a mass basis.

It is understood from FIG. 11 and Table 3 that a cut-off wavelength in the wavelength range of 550 nm to 800 nm, a cut-off wavelength in the wavelength range of 1000 nm to 1800 nm, a cut-off wavelength in the wavelength range of 350 nm to 450 nm in the transmission spectrum of the optical filter according to Example 16 do not greatly vary depending on the change in the temperature of the optical filter from 25° C. to 70° C.

TABLE 1

|  | Mass ratio between amount Cf of aryl-containing phosphonic acid and amount Cs of alkyl-containing phosphonic acid | | Added amount of alkoxysilane in production of compound including aryl-containing phosphonic acid [g] | | Added amount of alkoxysilane in production of light-absorbing composition [g] | | | |
|---|---|---|---|---|---|---|---|---|
|  | Cf | Cs | MTES | TEOS | MTES | TEOS | DMDES | DMDMS |
| Example 1 | 71 | 29 | 6.151 | 2.016 | 7.696 | 4.015 | 3.476 | 0.000 |
| Example 2 | 71 | 29 | 6.151 | 2.016 | 9.236 | 4.015 | 2.317 | 0.000 |
| Example 3 | 71 | 29 | 6.151 | 2.016 | 13.854 | 6.028 | 3.476 | 0.000 |
| Example 4 | 71 | 29 | 6.151 | 2.016 | 17.509 | 7.033 | 3.046 | 0.000 |
| Example 5 | 71 | 29 | 6.151 | 2.016 | 21.55 | 8.037 | 2.317 | 0.000 |
| Example 6 | 71 | 29 | 6.151 | 2.016 | 25.975 | 9.042 | 1.304 | 0.000 |
| Example 7 | 71 | 29 | 6.151 | 2.016 | 20.203 | 7.033 | 1.014 | 0.000 |
| Example 8 | 71 | 29 | 6.151 | 2.016 | 7.696 | 4.015 | 0.000 | 2.818 |
| Example 9 | 71 | 29 | 6.151 | 2.016 | 6.157 | 4.015 | 4.635 | 0.000 |
| Example 10 | 71 | 29 | 6.151 | 2.016 | 4.618 | 4.015 | 5.793 | 0.000 |
| Example 11 | 71 | 29 | 6.151 | 2.016 | 3.078 | 4.015 | 6.952 | 0.000 |
| Example 12 | 71 | 29 | 6.151 | 2.016 | 7.696 | 4.015 | 3.476 | 0.000 |
| Example 13 | 71 | 29 | 6.151 | 2.016 | 7.696 | 4.015 | 3.476 | 0.000 |
| Example 14 | 71 | 29 | 6.151 | 2.016 | 7.696 | 4.015 | 3.476 | 0.000 |
| Example 15 | 71 | 29 | 6.151 | 2.016 | 7.696 | 4.015 | 3.476 | 0.000 |
| Example 16 | 71 | 29 | 6.151 | 2.016 | 7.696 | 4.015 | 3.476 | 0.000 |
| Example 17 | 83 | 17 | 7.191 | 2.357 | 7.696 | 4.015 | 3.476 | 0.000 |
| Example 18 | 59 | 41 | 5.112 | 1.676 | 7.696 | 4.015 | 3.476 | 0.000 |
| Example 19 | 50 | 50 | 4.332 | 1.420 | 7.696 | 4.015 | 3.476 | 0.000 |
| Example 20 | 100 | 0 | 8.664 | 2.840 | 7.696 | 4.015 | 3.476 | 0.000 |
| Example 21 | 40 | 60 | 3.466 | 1.136 | 7.696 | 4.015 | 3.476 | 0.000 |
| Comparative Example 1 | 29 | 71 | 2.513 | 0.824 | 7.696 | 4.015 | 3.476 | 0.000 |

|  | Added amount of curable resin in production of light-absorbing composition [g] | Added amount of catalyst in production of light-absorbing composition [g] | Total amount of each alkoxysilane in production of light-absorbing composition [g] | | | |
|---|---|---|---|---|---|---|
|  |  |  | MTES | TEOS | DMDES | DMDMS |
| Example 1 | 8.925 | 0.089 | 13.847 | 6.031 | 3.476 | 0.000 |
| Example 2 | 6.250 | 0.063 | 15.387 | 6.031 | 2.317 | 0.000 |
| Example 3 | 5.357 | 0.054 | 20.005 | 8.044 | 3.476 | 0.000 |
| Example 4 | 4.018 | 0.040 | 23.66 | 9.049 | 3.046 | 0.000 |
| Example 5 | 2.679 | 0.027 | 27.701 | 10.053 | 2.317 | 0.000 |
| Example 6 | 2.054 | 0.021 | 32.126 | 11.058 | 1.304 | 0.000 |
| Example 7 | 0.000 | 0.000 | 26.354 | 9.049 | 1.014 | 0.000 |
| Example 8 | 8.925 | 0.089 | 13.847 | 6.031 | 0.000 | 2.818 |
| Example 9 | 8.925 | 0.089 | 12.308 | 6.031 | 4.6347 | 0.000 |
| Example 10 | 8.925 | 0.089 | 10.769 | 6.031 | 5.7933 | 0.000 |
| Example 11 | 8.925 | 0.089 | 9.2294 | 6.031 | 6.952 | 0.000 |
| Example 12 | 11.156 | 0.112 | 13.847 | 6.031 | 3.476 | 0.000 |
| Example 13 | 13.388 | 0.134 | 13.847 | 6.031 | 3.476 | 0.000 |
| Example 14 | 17.85 | 0.179 | 13.847 | 6.031 | 3.476 | 0.000 |
| Example 15 | 22.313 | 0.223 | 13.847 | 6.031 | 3.476 | 0.000 |
| Example 16 | 8.925 | 0.089 | 13.847 | 6.031 | 3.476 | 0.000 |
| Example 17 | 8.925 | 0.089 | 14.887 | 6.372 | 3.476 | 0.000 |
| Example 18 | 8.925 | 0.089 | 12.808 | 5.691 | 3.476 | 0.000 |
| Example 19 | 8.925 | 0.089 | 12.028 | 5.435 | 3.476 | 0.000 |
| Example 20 | 8.925 | 0.089 | 16.36 | 6.855 | 3.476 | 0.000 |
| Example 21 | 8.925 | 0.089 | 11.162 | 5.151 | 3.476 | 0.000 |
| Comparative Example 1 | 8.925 | 0.089 | 10.209 | 4.839 | 3.476 | 0.000 |

TABLE 2

| | Solid amount of each alkoxysilane [g] | | | | Total amount | Solid amount of curable resin [g] | Mass ratio between solids of alkoxysilanes | | | | Mass ratio of solid of curable resin to total amount of solids of alkoxy-silanes | Mass ratio of solid of bifunctional alkoxy-silane to solids of alkoxy-silanes and curable resin |
|---|---|---|---|---|---|---|---|---|---|---|---|---|
| | MTES | TEOS | DMDES | DMDMS | | | MTES | TEOS | DMDES | DMDMS | | |
| Example 1 | 5.227 | 1.747 | 1.738 | 0.000 | 8.711 | 4.463 | 0.600 | 0.200 | 0.200 | 0.000 | 0.51 | 0.13 |
| Example 2 | 5.808 | 1.747 | 1.159 | 0.000 | 8.713 | 3.125 | 0.667 | 0.200 | 0.133 | 0.000 | 0.36 | 0.10 |
| Example 3 | 7.551 | 2.330 | 1.738 | 0.000 | 11.619 | 2.679 | 0.650 | 0.200 | 0.150 | 0.000 | 0.23 | 0.12 |
| Example 4 | 8.930 | 2.621 | 1.523 | 0.000 | 13.074 | 2.009 | 0.683 | 0.200 | 0.117 | 0.000 | 0.15 | 0.10 |
| Example 5 | 10.456 | 2.911 | 1.159 | 0.000 | 14.526 | 1.340 | 0.720 | 0.200 | 0.080 | 0.000 | 0.09 | 0.07 |
| Example 6 | 12.126 | 3.202 | 0.652 | 0.000 | 15.980 | 1.027 | 0.759 | 0.200 | 0.041 | 0.000 | 0.06 | 0.04 |
| Example 7 | 9.947 | 2.621 | 0.507 | 0.000 | 13.075 | 0.000 | 0.761 | 0.200 | 0.039 | 0.000 | 0.00 | 0.04 |
| Example 8 | 5.227 | 1.747 | 0.000 | 1.738 | 8.711 | 4.463 | 0.600 | 0.200 | 0.000 | 0.200 | 0.51 | 0.13 |
| Example 9 | 4.646 | 1.747 | 2.318 | 0.000 | 8.710 | 4.463 | 0.533 | 0.201 | 0.266 | 0.000 | 0.51 | 0.18 |
| Example 10 | 4.065 | 1.747 | 2.897 | 0.000 | 8.708 | 4.463 | 0.467 | 0.201 | 0.333 | 0.000 | 0.51 | 0.22 |
| Example 11 | 3.484 | 1.747 | 3.477 | 0.000 | 8.707 | 4.463 | 0.400 | 0.201 | 0.399 | 0.000 | 0.51 | 0.26 |
| Example 12 | 5.227 | 1.747 | 1.738 | 0.000 | 8.711 | 5.578 | 0.600 | 0.200 | 0.200 | 0.000 | 0.64 | 0.12 |
| Example 13 | 5.227 | 1.747 | 1.738 | 0.000 | 8.711 | 6.694 | 0.600 | 0.200 | 0.200 | 0.000 | 0.77 | 0.11 |
| Example 14 | 5.227 | 1.747 | 1.738 | 0.000 | 8.711 | 8.925 | 0.600 | 0.200 | 0.200 | 0.000 | 1.02 | 0.10 |
| Example 15 | 5.227 | 1.747 | 1.738 | 0.000 | 8.711 | 11.156 | 0.600 | 0.200 | 0.200 | 0.000 | 1.28 | 0.09 |
| Example 16 | 5.227 | 1.747 | 1.738 | 0.000 | 8.711 | 4.463 | 0.600 | 0.200 | 0.200 | 0.000 | 0.51 | 0.13 |
| Example 17 | 5.619 | 1.845 | 1.738 | 0.000 | 9.203 | 4.463 | 0.611 | 0.201 | 0.189 | 0.000 | 0.48 | 0.13 |
| Example 18 | 4.834 | 1.648 | 1.738 | 0.000 | 8.221 | 4.463 | 0.588 | 0.200 | 0.211 | 0.000 | 0.54 | 0.14 |
| Example 19 | 4.540 | 1.574 | 1.738 | 0.000 | 7.852 | 4.463 | 0.578 | 0.200 | 0.221 | 0.000 | 0.57 | 0.14 |
| Example 20 | 6.175 | 1.985 | 1.738 | 0.000 | 9.899 | 4.463 | 0.624 | 0.201 | 0.176 | 0.000 | 0.45 | 0.12 |
| Example 21 | 4.213 | 1.492 | 1.738 | 0.000 | 7.443 | 4.463 | 0.566 | 0.200 | 0.234 | 0.000 | 0.60 | 0.15 |
| Comparative Example 1 | 3.853 | 1.401 | 1.738 | 0.000 | 6.993 | 4.463 | 0.551 | 0.200 | 0.249 | 0.000 | 0.64 | 0.15 |

TABLE 3

| | Minimum of transmittance in wavelength range of 450 nm to 600 nm [%] | Maximum of transmittance in wavelength range of 300 nm to 370 nm [%] | Maximum of transmittance in wavelength range of 800 nm to 1000 nm [%] | Minimum of transmittance in wavelength range of 1500 nm to 1700 nm [%] | Cut-off wavelength in wavelength range of 550 nm to 800 nm [nm] | Cut-off wavelength in wavelength range of 1000 nm to 1800 nm [nm] |
|---|---|---|---|---|---|---|
| Example 1 | 82.16 | 0.08 | 0.24 | 78.42 | 644 | 1370 |
| Example 2 | 81.36 | 0.05 | 0.17 | 77.28 | 641 | 1378 |
| Example 3 | 80.90 | 0.04 | 0.34 | 76.75 | 640 | 1382 |
| Example 4 | 81.65 | 0.12 | 0.23 | 78.18 | 643 | 1369 |
| Example 5 | 80.34 | 0.06 | 0.17 | 76.47 | 639 | 1383 |
| Example 6 | 80.64 | 0.03 | 0.19 | 76.42 | 640 | 1385 |
| Example 7 | 80.95 | 0.08 | 0.16 | 77.36 | 641 | 1377 |
| Example 8 | 80.58 | 0.06 | 0.25 | 76.77 | 639 | 1381 |
| Example 9 | 81.15 | 0.02 | 0.27 | 76.38 | 640 | 1388 |
| Example 10 | 80.91 | 0.02 | 0.33 | 75.80 | 640 | 1392 |
| Example 11 | 80.73 | 0.02 | 0.26 | 75.85 | 640 | 1393 |
| Example 12 | 81.77 | 0.04 | 0.21 | 77.63 | 642 | 1375 |
| Example 13 | 81.27 | 0.03 | 0.30 | 77.22 | 641 | 1379 |
| Example 14 | 82.71 | 0.12 | 0.29 | 79.33 | 646 | 1360 |
| Example 15 | 83.50 | 0.27 | 0.60 | 80.63 | 650 | 1343 |
| Ex. 16 25° C. | 81.12 | 0.04 | 0.07 | 77.83 | 639 | 1381 |
| 70° C. | 78.99 | 0.01 | 0.08 | 74.37 | 635 | 1395 |
| Example 17 | 78.32 | 0.02 | 0.26 | 80.61 | 633 | 1340 |
| Example 18 | 84.02 | 0.62 | 0.21 | 74.82 | 652 | 1399 |
| Example 19 | 83.22 | 0.98 | 0.06 | 70.04 | 655 | 1426 |
| Example 20 | 75.45 | 0.01 | 0.37 | 79.68 | 627 | 1237 |
| Example 21 | 82.09 | 2.30 | 0.20 | 65.51 | 658 | 1444 |
| Comparative Example 1 | 80.87 | 12.75 | 0.26 | 67.14 | 676 | 1437 |

TABLE 3-continued

|  | Cut-off wavelength in wavelength range of 350 nm to 450 nm [nm] | Maximum of transmittance in wavelength range of 1000 nm to 1100 nm [%] | Minimum of transmittance in wavelength range of 1700 nm to 1900 nm [%] | Minimum of transmittance in wavelength range of 1900 nm to 2200 nm [%] | Thickness [μm] |
|---|---|---|---|---|---|
| Example 1 | 405 | 0.61 | 84.10 | 82.94 | 188 |
| Example 2 | 406 | 0.44 | 83.20 | 82.41 | 181 |
| Example 3 | 406 | 0.36 | 82.78 | 82.00 | 197 |
| Example 4 | 403 | 0.69 | 83.50 | 82.63 | 171 |
| Example 5 | 405 | 0.38 | 82.42 | 81.29 | 186 |
| Example 6 | 406 | 0.34 | 82.54 | 81.50 | 172 |
| Example 7 | 404 | 0.48 | 82.80 | 82.22 | 152 |
| Example 8 | 404 | 0.40 | 82.48 | 81.35 | 217 |
| Example 9 | 408 | 0.29 | 82.54 | 81.68 | 216 |
| Example 10 | 408 | 0.23 | 82.03 | 81.07 | 212 |
| Example 11 | 408 | 0.22 | 81.91 | 81.20 | 220 |
| Example 12 | 407 | 0.53 | 82.56 | 81.48 | 212 |
| Example 13 | 408 | 0.46 | 81.90 | 79.62 | 235 |
| Example 14 | 406 | 1.03 | 82.50 | 80.42 | 223 |
| Example 15 | 404 | 2.10 | 82.68 | 80.22 | 207 |
| Ex. 16 25° C. | 408 | 0.37 | 84.37 | 83.67 | 206 |
| Ex. 16 70° C. | 414 | 0.36 | 83.59 | 83.61 | 206 |
| Example 17 | 410 | 1.03 | 82.37 | 80.19 | 242 |
| Example 18 | 400 | 0.27 | 84.05 | 84.26 | 163 |
| Example 19 | 398 | 0.05 | 83.07 | 83.78 | 185 |
| Example 20 | 413 | 4.96 | 81.66 | 77.82 | 279 |
| Example 21 | 394 | 0.12 | 81.17 | 82.72 | 183 |
| Comparative Example 1 | 385 | 0.12 | 82.64 | 84.93 | 237 |

TABLE 4

|  | Average transmittance in wavelength range of 1530 nm to 1570 nm [%] | Average transmittance in wavelength range of 1800 nm to 2100 nm [%] | Minimum of transmittance in wavelength range of 1600 nm to 1800 nm [%] | Minimum of transmittance in wavelength range of 2100 nm to 2200 nm [%] | Tr (1) | Tr (2) | Tr (3) |
|---|---|---|---|---|---|---|---|
| Example 1 | 83.44 | 89.91 | 82.89 | 82.94 | 0.95 | 0.92 | 0.92 |
| Example 2 | 82.66 | 89.63 | 82.02 | 82.41 | 0.95 | 0.92 | 0.92 |
| Example 3 | 82.28 | 89.37 | 81.54 | 82.00 | 0.95 | 0.91 | 0.92 |
| Example 4 | 83.21 | 89.62 | 82.42 | 82.63 | 0.95 | 0.92 | 0.92 |
| Example 5 | 82.06 | 89.19 | 81.13 | 81.29 | 0.94 | 0.91 | 0.91 |
| Example 6 | 82.02 | 89.29 | 81.24 | 81.50 | 0.94 | 0.91 | 0.91 |
| Example 7 | 82.56 | 89.43 | 81.71 | 82.22 | 0.94 | 0.91 | 0.92 |
| Example 8 | 82.22 | 89.23 | 81.15 | 81.35 | 0.94 | 0.91 | 0.91 |
| Example 9 | 82.19 | 89.56 | 81.33 | 81.68 | 0.94 | 0.91 | 0.91 |
| Example 10 | 81.83 | 89.53 | 81.03 | 81.07 | 0.94 | 0.90 | 0.91 |
| Example 11 | 81.81 | 89.44 | 81.04 | 81.20 | 0.95 | 0.91 | 0.91 |
| Example 12 | 82.94 | 89.41 | 81.51 | 81.48 | 0.95 | 0.91 | 0.91 |
| Example 13 | 82.58 | 89.26 | 80.24 | 79.62 | 0.95 | 0.90 | 0.89 |
| Example 14 | 84.02 | 89.58 | 80.54 | 80.42 | 0.96 | 0.90 | 0.90 |
| Example 15 | 84.98 | 89.69 | 80.63 | 80.22 | 0.96 | 0.90 | 0.89 |
| Ex. 16 25° C. | 83.61 | 90.62 | 83.09 | 83.67 | 0.95 | 0.92 | 0.92 |
| Ex. 16 70° C. | 80.97 | 91.42 | 82.25 | 83.61 | 0.93 | 0.90 | 0.91 |
| Example 17 | 84.52 | 89.15 | 80.88 | 80.19 | 0.97 | 0.91 | 0.90 |
| Example 18 | 81.24 | 89.71 | 83.00 | 84.26 | 0.93 | 0.93 | 0.94 |
| Example 19 | 78.28 | 89.74 | 82.03 | 83.78 | 0.90 | 0.91 | 0.93 |
| Example 20 | 87.36 | 88.57 | 79.68 | 77.82 | 1.01 | 0.90 | 0.88 |
| Example 21 | 75.00 | 88.57 | 80.17 | 82.72 | 0.87 | 0.91 | 0.93 |
| Comparative Example 1 | 76.21 | 89.22 | 81.95 | 84.93 | 0.89 | 0.92 | 0.95 |

The invention claimed is:

1. An optical filter comprising a light-absorbing layer, the light-absorbing-layer comprising:
   a copper complex;
   at least one selected from the group consisting of a first alkoxy-containing compound having two alkoxy groups per molecule and a hydrolysate of the first alkoxy-containing compound; and
   at least one selected from the group consisting of a second alkoxy-containing compound having three or four alkoxy groups per molecule and a hydrolysate of the second alkoxy-containing compound, wherein the optical filter is capable of transmitting a light with a first transmission spectrum for an incident light at an incident angle of 0° at 25° C., the first transmission spectrum satisfying the following requirements (i), (ii), (iii), and (iv):
(i) a minimum of a transmittance in a wavelength range of 450 nm to 600 nm is 70% or more;
(ii) a maximum of the transmittance in a wavelength range of 300 nm to 370 nm is 5% or less;
(iii) a maximum of the transmittance in a wavelength range of 800 nm to 1000 nm is 5% or less; and (iv) a minimum of the transmittance in a wavelength range of 1500 nm to 1700 nm is 60% or more.

2. The optical filter according to claim 1, wherein the first transmission spectrum further satisfies the following requirement (v):
(v) a first cut-off wavelength which lies in a wavelength range of 550 nm to 800 nm and at which the transmittance is 50% is in a range of 600 nm to 700 nm.

3. The optical filter according to claim 2, wherein
the optical filter is capable of transmitting a light with a second transmission spectrum for an incident light at an incident angle of 0° at 70° C.,
the second transmission spectrum has a fourth cut-off wavelength which lies in the wavelength range of 550 nm to 800 nm and at which the transmittance is 50%, and
an absolute value of a difference between the fourth cut-off wavelength and the first cut-off wavelength is 15 nm or less.

4. The optical filter according to claim 1, wherein the first transmission spectrum further satisfies the following requirement (vi):
(vi) a second cut-off wavelength which lies in a wavelength range of 1000 nm to 1800 nm and at which the transmittance is 50% is in a range of 1150 nm to 1500 nm.

5. The optical filter according to claim 4, wherein
the optical filter is capable of transmitting a light with a second transmission spectrum for an incident light at an incident angle of 0° at 70° C.,
the second transmission spectrum has a fifth cut-off wavelength which lies in the wavelength range of 1000 nm to 1800 nm and at which the transmittance is 50%, and
an absolute value of a difference between the fifth cut-off wavelength and the second cut-off wavelength is 30 nm or less.

6. The optical filter according to claim 1, wherein the first transmission spectrum further satisfies the following requirement (vii):
(vii) a third cut-off wavelength which lies in a wavelength range of 350 nm to 450 nm and at which the transmittance is 50% is in a range of 360 nm to 430 nm.

7. The optical filter according to claim 6, wherein
the optical filter is capable of transmitting a light with a second transmission spectrum for an incident light at an incident angle of 0° at 70° C.,
the second transmission spectrum has a sixth cut-off wavelength which lies in the wavelength range of 350 nm to 450 nm and at which the transmittance is 50%, and
an absolute value of a difference between the sixth cut-off wavelength and the third cut-off wavelength is 15 nm or less.

8. The optical filter according to claim 1, wherein in the first transmission spectrum, an absolute value of a difference between a first cut-off wavelength and a second cut-off wavelength is 600 nm or more and 800 nm or less, the first cut-off wavelength being a wavelength which lies in a wavelength range of 550 nm to 800 nm and at which the transmittance is 50%, the second cut-off wavelength being a wavelength which lies in a wavelength range of 1000 nm to 1800 nm and at which the transmittance is 50%.

9. The optical filter according to claim 1, wherein in the first transmission spectrum, an absolute value of a difference between a first cut-off wavelength and a third cut-off wavelength is 200 nm or more and 270 nm or less, the first cut-off wavelength being a wavelength which lies in a wavelength range of 550 nm to 800 nm and at which the transmittance is 50%, the third cut-off wavelength being a wavelength which lies in a wavelength range of 350 nm to 450 nm and at which the transmittance is 50%.

10. The optical filter according to claim 1, wherein the first transmission spectrum further satisfies the following requirement (viii):
(viii) a maximum of the transmittance in a wavelength range of 1000 nm to 1100 nm is 10% or less.

11. The optical filter according to claim 1, wherein the first transmission spectrum further satisfies the following requirement (ix):
(ix) a minimum of the transmittance in a wavelength range of 1700 nm to 1900 nm is 60% or more.

12. The optical filter according to claim 1, wherein the transmittance at a wavelength of 1550 nm is 70% or more in the first transmission spectrum.

13. The optical filter according to claim 1, wherein the first transmission spectrum further satisfies the following requirement (x):
(x) a minimum of the transmittance in a wavelength range of 1900 nm to 2200 nm is 60% or more.

14. The optical filter according to claim 1, comprising a light-absorbing layer including a light absorber, the light-absorbing layer having a thickness of 100 µm to 400 µm.

15. An optical apparatus comprising:
a camera module capable of obtaining image information on an object, the image information being recognized by means of visible light;
a time-of-flight (TOF) sensor capable of obtaining distance measurement information on a distance from an object; and
the optical filter according to claim 1 placed in front of the camera module and the TOF sensor.

16. The optical apparatus according to claim 15, wherein the TOF sensor comprises: an irradiator capable of irradiating an object with light with a wavelength in a wavelength range of 1500 nm to 2200 nm; a light receiver capable of receiving reflected light with a wavelength in a wavelength range of 1500 nm to 2200 nm from the object; and a controller.

17. A light-absorbing composition comprising:
a copper complex;
at least one selected from the group consisting of a first alkoxy-containing compound having two alkoxy groups per molecule and a hydrolysate of the first alkoxy-containing compound; and
at least one selected from the group consisting of a second alkoxy-containing compound having three or four alkoxy groups per molecule and a hydrolysate of the second alkoxy-containing compound, wherein
the light-absorbing composition is capable of being cured into a light-absorbing film, the light-absorbing film being capable of transmitting a light with a third transmission spectrum for an incident light at an incident angle of 0° at 25° C., the third transmission spectrum satisfying the following requirements (i), (ii), (iii), and (iv):

(i) a minimum of a transmittance in a wavelength range of 450 nm to 600 nm is 70% or more;

(ii) a maximum of the transmittance in a wavelength range of 300 nm to 370 nm is 5% or less;

(iii) a maximum of the transmittance in a wavelength range of 800 nm to 1000 nm is 5% or less; and (iv) a minimum of the transmittance in a wavelength range of 1500 nm to 1700 nm is 60% or more.

18. The light-absorbing composition according to claim 17, wherein the light-absorbing composition satisfies the following requirement (I), the following requirement (II), or both;

(I) a ratio of a total amount of the first alkoxy-containing compound and the hydrolysate thereof calculated in terms of complete-hydrolysis-condensation products to a total amount of a compound having an alkoxy group and a hydrolysate thereof calculated in terms of complete-hydrolysis-condensation products is 0.01 to 0.6 on a mass basis, (II) a ratio of a solid amount of a curable resin to a total amount of a compound having an alkoxy group and a hydrolysate thereof calculated in terms of complete-hydrolysis-condensation products is 0 to 2 on a mass basis.

19. The light-absorbing composition according to claim 17, wherein a ratio of a total amount of the first alkoxy-containing compound and the hydrolysate thereof calculated in terms of complete-hydrolysis-condensation products to a sum of a total amount of a compound having an alkoxy group and a hydrolysate thereof calculated in terms of complete-hydrolysis-condensation products and a solid amount of a curable resin is 0.01 to 0.4 on a mass basis.

20. The light-absorbing composition according to claim 17, wherein an amount $C_f$ of a phosphonic acid having an aryl group and an amount $C_s$ of a phosphonic acid having an alkyl group satisfy a relation of $C_f:C_s=50:50$ to $100:0$ on a mass basis.

* * * * *